United States Patent
Verschuuren et al.

(10) Patent No.: US 12,006,441 B2
(45) Date of Patent: Jun. 11, 2024

(54) IMPRINTING INK COMPOSITION, IMPRINTING METHOD, OPTICAL ELEMENT LIGHTING DEVICE, OPTICAL SENSOR AND PHOTOVOLTAIC DEVICE

(71) Applicant: KONINKLIJKE PHILIPS N.V., Eindhoven (NL)

(72) Inventors: Marcus Antonius Verschuuren, Berkel-Enschot (NL); Anne Souren, Eindhoven (NL)

(73) Assignee: Koninklijke Philips N.V., Eindhoven (NL)

( * ) Notice: Subject to any disclaimer, the term of this patent is extended or adjusted under 35 U.S.C. 154(b) by 597 days.

(21) Appl. No.: 15/767,456

(22) PCT Filed: Oct. 13, 2016

(86) PCT No.: PCT/EP2016/074544
§ 371 (c)(1),
(2) Date: Apr. 11, 2018

(87) PCT Pub. No.: WO2017/067838
PCT Pub. Date: Apr. 27, 2017

(65) Prior Publication Data
US 2018/0305567 A1 Oct. 25, 2018

(30) Foreign Application Priority Data
Oct. 20, 2015 (EP) .................................... 15190487

(51) Int. Cl.
C09D 11/102 (2014.01)
C09D 11/00 (2014.01)
(Continued)

(52) U.S. Cl.
CPC ............ *C09D 11/102* (2013.01); *C09D 11/00* (2013.01); *C09D 11/02* (2013.01); *C09D 11/037* (2013.01);
(Continued)

(58) Field of Classification Search
None
See application file for complete search history.

(56) References Cited

U.S. PATENT DOCUMENTS 8,835,102 B2 9/2014 Ogihara et al.
2005/0069718 A1* 3/2005 Voss-Kehl ............. B82Y 30/00
428/447

(Continued)

FOREIGN PATENT DOCUMENTS

JP 2011170073 A 9/2011
WO WO2009032072 A2 3/2009
WO WO2014097096 A1 6/2014

OTHER PUBLICATIONS

Landwehr, J. et al., "Optical Polymers with Tunable Refractive Index for Nanoprint Technologies", IOP Publishing, Nanotechnology 25, (2014) 505301, (10pp).

*Primary Examiner* — Mohammad M Ameen

(57) ABSTRACT

Disclosed are imprinting ink compositions for use in imprinting techniques such as SCIL. The imprinting ink compositions comprise TMO nanoparticles stabilized by selected polymerization inhibitors that allow for the formation of a stable imprinting ink composition in which polymerization of the TMO nanoparticles is effectively suppressed and from which high refractive index patterned layers can be formed. Imprinting methods using such imprinting ink compositions, optical devices including patterned layers formed from such imprinting ink compositions and lighting devices, (Continued)

optical sensors and photovoltaic devices including such optical elements are also disclosed.

12 Claims, 9 Drawing Sheets

(51) Int. Cl.
| | |
|---|---|
| *C09D 11/02* | (2014.01) |
| *C09D 11/037* | (2014.01) |
| *C09D 17/00* | (2006.01) |
| *G03F 7/00* | (2006.01) |
| *H01L 31/0232* | (2014.01) |
| *H01L 31/054* | (2014.01) |
| *H01L 33/58* | (2010.01) |
| *G01J 1/04* | (2006.01) |

(52) U.S. Cl.
CPC ......... *C09D 17/007* (2013.01); *C09D 17/008* (2013.01); *G03F 7/0002* (2013.01); *H01L 31/02327* (2013.01); *H01L 31/0543* (2014.12); *H01L 33/58* (2013.01); *G01J 1/0407* (2013.01); *H01L 2933/0058* (2013.01); *Y02E 10/52* (2013.01)

(56) References Cited

U.S. PATENT DOCUMENTS

| | | | |
|---|---|---|---|
| 2010/0216911 A1* | 8/2010 | Doshi | C08K 3/22 523/200 |
| 2013/0183500 A1* | 7/2013 | Kasperchik | B41M 5/502 428/207 |
| 2014/0072720 A1 | 3/2014 | Watkins | |

* cited by examiner

IMPRINTING INK COMPOSITION, IMPRINTING METHOD, OPTICAL ELEMENT LIGHTING DEVICE, OPTICAL SENSOR AND PHOTOVOLTAIC DEVICE

FIELD OF THE INVENTION

The present invention relates to an imprinting ink composition, comprising a solvent and polymerizable content dissolved and/or dispersed in the solvent, the polymerizable content comprising transition metal oxide nanoparticles.

The present invention further relates to a method of forming a patterned layer with such an imprinting ink composition.

The present invention yet further relates to an optical element including such a patterned layer.

The present invention yet further relates to a lighting device, optical sensor or photovoltaic device including such an optical element.

BACKGROUND OF THE INVENTION

The direct patterning of high index materials is of interest to application such as photonics, LEDs and photovoltaics. Especially materials that can reach a refractive index higher than n=1.8 up to n=2.5 and have little to no absorption in visible wavelengths are of interest and difficult to achieve. The high index for instance is required to index-match sapphire (n=1.8) and GaN (n=2.4) materials (substrates) used in solid state lighting, or to approach the refractive index of silicon, as well as facilitate light extraction or in-coupling in the form of a refractive optical element. For example, in solar applications it has so far proven impossible for materials to match the refractive index of silicon without having absorption in the visible part of the electromagnetic spectrum (i.e. visible light), but good light in-coupling results have been achieved using designed scattering elements made from $TiO_2$ having a refractive index n of 2.3 across the visible part of the electromagnetic spectrum.

Especially for improved light management structuring, high index materials having micro- and nano-meter dimensions are required. High index materials are usually made in continuous layers using evaporation, sputtering, vacuum techniques, where the substrate does not need to reach a very high temperatures (usually from room temperature to 300° C.), or CVD or ALD deposition techniques with temperatures up to 1000° C. Commonly used materials mostly consist of transition metal oxides (TMO) such as $TiO_2$, $ZrO_2$, $HfO_2$, $Ta_2O_3$, $V_2O_3$, $Nb_2O_3$, $Y_2O_3$ and $Fe_2O_3$ or composite TMOs such as $BaTiO_3$ and $SrTiO_3$. However, these continuous layers are not ideally suited to create optical elements having tailor-made optical properties as such properties are typically required by an appropriate pattern shape and dimensions. Nano-patterning such continuous TMO layers is cumbersome, as they are very hard and chemically inert which does not allow to pattern these materials using an etch mask and wet etching chemistry. The only dry etching option routinely available is ion milling using high energy Ar ions which is still slow, not fully anisotropic, requires a thick sturdy etch mask and damages underlying layers due to ion damage.

In order to obtain such patterned TMO layers, a wet-chemical route may be considered where patterns can be patterned during the formation of the layer using a stamping method.

A first wet chemical route is to prepare patterned TMO layers by a sol-gel route whereby the element precursors react to form the oxides in the sol-gel route. This route still suffers from the problem that continuous layers are formed in this manner, and to reach a high refractive index the materials need to be annealed at high temperatures, typically 600-800° C. During this heat treatment, the materials will densify and shrink up to 70-90%. This will lead to stress in the layers which results in cracking and delamination once the layer thicknesses go above the critical layer thickness of typically 100-300 nm. Formed features will also significantly shrink and deform or delaminate. This high shrinkage is related to the high reactivity of the TMO sol-gel precursors and the extended network formation capability. This will allow the system to effectively build a 3D network at low solid contents, even where there is a high volume of solvents present. Consequently, during final drying and/or sintering the 3D network will collapse and build up stress, e.g. because of large amounts of solvent being expelled from the patterned layer during drying.

An alternative wet-chemical route is to use nanoparticle dispersions of the TMO instead of molecular precursors. The sol typically consists of nanoparticles of a TMO, usually stabilised by a positive charge on the particle in a dispersion or sol with a pH of between 0 and 1. In these systems the nanoparticles also form a 3D network by reactions between the reactive chemical groups on the surface of the TMO particles, e.g. —OH, —COOH, —$NH_2$, —SH groups or the like, which are the remnants of the synthesis routes for such TMO nanoparticles. This also leads to relatively porous layers, although the pore size is much larger compared to the sol-gel route. Again, this will limit the maximal layer thickness due to the build-up of stresses and an accompanied low refractive index during curing, e.g. heating, of the particle layer.

Hence, a problem with the formation of nano-patterned TMO layers, e.g. for use in optical applications such as refractive or diffractive optical elements, using a wet chemistry approach is that such layers effectively can form a 3D network and gel in a low solid content regime due to the intrinsic presence of reactive surface groups as explained above. This leads to ill-defined features, high shrinkage and a low refractive index of the patterned layers.

J. Landwehr et al. in Nanotechnology 25 (2014), 505301 disclose optical polymers with tuneable refractive indices for nanoimprint technologies. $TiO_2$ nanoparticles smaller than 10 nm were synthesized using the non-aqueous sol method and in situ stabilized by three different organic surfactants selected from 4-tert-butylcatechol, trimethoxy(7-octen-1-yl)silane and trioctylphosphine oxide. These particles were added in an amount of 23 wt % to a UV-curable epoxy polymer composite (based on the weight of the composite), which increased the refractive index of the composite at 635 nm from 1.542 for the pure polymer to 1.626. Temperature treatment up to 220° C. led to modest shrinkage of 4% in the formed composite layer including the $TiO_2$ nanoparticles. The $TiO_2$ nanoparticles existed isolated in the polymer matrix. However, it is difficult to obtain patterned layers having even higher refractive indices in this manner due to the large organic polymer fraction required in these layers in order to isolate the $TiO_2$ nanoparticles from each other. Additionally the combination of $TiO_2$ nanoparticles in an organic matrix can degrade the stability of these materials regarding light and temperature. The $TiO_2$ surface can catalyse the degradation and oxidation of the organic matrix, leading to yellowing/browning and degraded mechanical properties. Such degradation proceeds under influence of visible light and moderate temperatures from room temperature (RT) and can happen quickly at temperatures of 150° C. or higher.

SUMMARY OF THE INVENTION

The present invention seeks to provide an imprinting ink composition that can yield good quality patterned layers having a high refractive index for visible light.

The present invention further seeks to provide an imprinting method for forming patterned layers using such an imprinting ink composition.

The present invention yet further seeks to provide an optical element comprising a patterned layer having a high refractive index for visible light that is obtainable by such a method.

The present invention still further seeks to provide a lighting device, optical sensor or photovoltaic device comprising such an optical element.

According to an aspect, there is provided an imprinting ink composition, comprising a solvent; polymerizable content dissolved and/or dispersed in the solvent, the polymerizable content comprising transition metal oxide particles forming at least 80% by weight of the total weight of the polymerizable content, the polymerizable content forming 2-25% by weight based on the total weight of the imprinting ink composition; and at least one polymerization inhibitor of any of Formula 1-3 present in a range of 0.07-7.00% by weight based on the total weight of the imprinting ink composition:

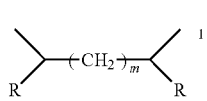

Formula 1 wherein in Formula 1, $R_1$ is hydrogen, $C_1$-$C_4$ alkyl or —($-C_2H_5-O-$)$_n$—$R_{13}$, wherein n is 1, 2 or 3 and $R_{13}$ is a $C_1$-$C_3$ alkyl; $R_2$ and $R_3$ individually are selected from hydrogen or $C_1$-$C_4$ alkyl and m is 0, 1, 2 or 3;

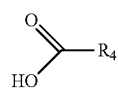

Formula 2 wherein in Formula 2, $R_4$ is hydrogen, methyl or ethyl;

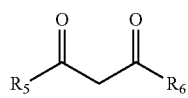

Formula 3 wherein in Formula 3, $R_5$ and $R_6$ are individually selected from hydrogen and $C_1$-$C_3$ alkyl.

It has been found that the polymerization inhibitors or stabilizers according to Formulae 1-3 are capable of effectively stabilizing TMO particles in such a composition, thereby effectively preventing the formation of 3-D networks or gels that lead to poor quality patterned layers. Moreover, the relatively small molecular weight of these polymerization inhibitors ensures that they can be readily removed from the nanoparticles during imprinting at RT or modestly elevated temperatures through diffusion into a permeable elastomeric stamp such as a polysiloxane stamp, for example a PDMS stamp, thereby enabling the TMO particles to polymerize at the desired point in time.

The imprinting ink composition preferably is acidic and more preferably has a pH of below 3.

The TMO particles preferably have average diameters smaller than 1 micrometer and are nanoparticles. They preferably are nanoparticles with average diameter smaller than 100 nm. Yet even more preferably, the transition metal oxide (TMO) nanoparticles have a particle size distribution from a lower value ranging from 1-10 nm to an upper value ranging from 20-40 nm, wherein the particle size distribution more preferably is 5-30 nm. The provision of TMO nanoparticles of different sizes within the aforementioned size distribution ensures that when forming a 3-D network from such particles during a polymerization reaction, e.g. when heating the composition, particularly dense (patterned) layers can be formed, which leads to particularly high refractive index layers.

The transition metal oxide nanoparticles may be selected from $TiO_2$, $ZrO_2$, $HfO_2$, $Ta_2O_3$, $V_2O_3$, $Nb_2O_3$, $Y_2O_3$, $Fe_2O_3$, $BaTiO_3$ and $SrTiO_3$ nanoparticles. Preferred are anatase or rutile $TiO_2$ nanoparticles, with rutile $TiO_2$ nanoparticles being particularly preferred, as rutile $TiO_2$ nanoparticles exhibit the highest refractive index in the visible range with negligible absorption down to 400 nm.

The imprinting ink composition may further comprise up to 20% by weight of a polymer matrix precursor based on a total weight of the polymerizable content. Such a polymer matrix precursor can be used to form a network interlinking with the network formed by the TMO nanoparticles, thereby substantially filling the voids in the TMO nanoparticle network. This further increases the refractive index of the (patterned) layer formed from such an imprinting ink composition.

The polymer matrix precursor may be a polysiloxane precursor such as a precursor comprising at least one monomeric unit according to Formula 5:

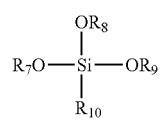

Formula 5 wherein $R_7$-$R_9$ are individually selected from $C_1$-$C_3$ alkyl; and $R_{10}$ is selected from $C_1$-$C_3$ alkyl, $C_1$-$C_3$ alkoxy and —$(CH_2)_n$$NHR_{11}$, wherein $R_{11}$ is selected from hydrogen and —$(CH_2)_m$$NH_2$, wherein m and n are individually selected from 2, 3 and 4.

Particularly suitable monomeric units include monomeric units according to Formula 6-9:

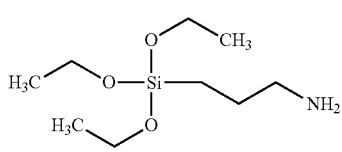

Formula 6

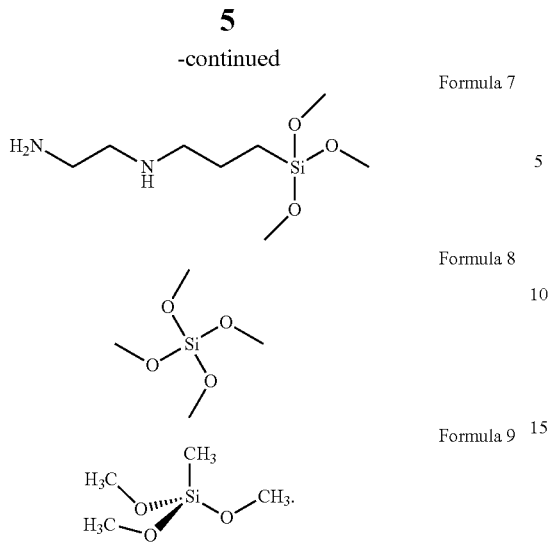

Formula 7

Formula 8

Formula 9

Polysiloxane precursors are particularly preferred because of their suitability for imprinting and good dimensional stability for instance in terms of limited layer shrinkage.

The imprinting ink composition may further comprise ammonia in an amount sufficient to adjust the pH of the imprinting ink composition to above 1. This has the advantage that the imprinting ink composition becomes less corrosive and is more compatible with various types of substrates and stamp materials such as PDMS. In addition, by tuning the pH of the imprinting ink composition to above 1, it has been found that polymerization characteristics of the ink, e.g. the degree of condensation, as well as stabilizer behaviour, may be better controlled. In this embodiment, stabilizers according to Formula 1 are preferred in order to reduce the risk of gel formation due to nanoparticles cross-linking.

The solvent may be selected from at least one of water and methanol. In a particularly advantageous embodiment, the solvent is a solvent mixture further comprising propoxyethanol up to 40% by weight based on the total weight of the imprinting ink composition. It has been found that the addition of propoxyethanol as a co-solvent significantly improves the applicability of the imprinting ink composition to a substrate using deposition techniques such as spin coating.

According to another aspect, there is provide a method of forming a patterned layer, comprising providing a stamp comprising an elastomeric material having a patterned surface; imprinting the imprinting ink composition of any of the above embodiments with the patterned surface; curing the polymeric content in the imprinting ink composition; and releasing the stamp from the cured polymeric content to obtain the patterned layer. The imprinting ink composition may be deposited directly onto the patterned surface of the elastomeric stamp or alternatively may be deposited onto a substrate and subsequently imprinted with the patterned surface of the elastomeric stamp. This method is capable of yielding patterned layers having μm or nm-sized pattern features that exhibit a refractive index across the visible part of the electromagnetic spectrum in excess of 1.7 or even 1.8. Such patterned layers have suitability as optical layers in optical elements as well as have suitability as masking layers on a substrate, for instance in the manufacturing process of a semiconductor device.

The elastomeric material preferably is a polysiloxane, more preferably polydimethylsiloxane. Polysiloxanes and in particular PDMS are particularly suitable as patterned stamps for such imprinting methods due to the permeable nature towards gasses and solvents of such stamps, which facilitates the removal of non-polymerizing components from the imprinting ink compositions through diffusion of these non-polymerizing components into the stamp, thereby concentrating the polymerizable content of the imprinting ink compositions, thus shifting the equilibrium of the reversible reactions in these compositions towards polycondensation, such that the desired 3-D networks can be effectively formed upon the application of the appropriate curing stimulus.

In some embodiments, a post-curing step comprises heating the imprinted imprinting ink composition to a temperature in the range of 80-120° C. for a period of 10-60 minutes. This effectively forms the networks in the patterned layers and removes the solvent(s) and polymerization inhibitors through diffusion into the stamp, thereby yielding the desired highly refractive patterned layers at a relatively low temperatures, which significantly reduces the risk of layer shrinkage and stress typically associated with high temperature (e.g. T>200° C.) processing of such layers.

According to yet another aspect, there is provided an optical element comprising a patterned layer obtainable by any embodiment of the method of the present invention. Such a patterned layer may have a thickness and/or pattern feature dimensions ranging from nanometer-sized dimensions such as dimensions in the wavelength range of visible light to several tens of microns and is characterized by a refractive index across the visible part of the electromagnetic spectrum in excess of 1.7, 1.8 or even 1.9. In some embodiments, the refractive index may be as high as 2.3-2.5. The pattern of the patterned layer may be tuned to the particular optical requirements of the optical element as will be readily understood. Examples of such an optical element include but are not limited to lenses, light scattering elements, collimators, in-coupling elements, waveguides, photonic devices such as ring resonators, wavelength filters, amplitude modifiers, and so on.

According to still another aspect, there is provided a lighting device comprising at least one solid state light source and the optical element according to any of the above embodiments arranged to redirect at least part of the luminous output of the at least one solid state light source. Due to the high refractive index of the patterned layer of the optical element, this for instance facilitates compact lighting devices.

According to still another aspect, there is provided an optical sensor comprising the optical element according to any of the above embodiments.

According to still another aspect, there is provided a photovoltaic device comprising a photovoltaic cell and the optical element according to any of the above embodiments. The optical element may be arranged as an in-coupling element for the photovoltaic cell. The photovoltaic device may be a solar cell or solar panel.

BRIEF DESCRIPTION OF THE DRAWINGS

Embodiments of the invention are described in more detail and by way of non-limiting examples with reference to the accompanying drawings, wherein.

DETAILED DESCRIPTION OF THE EMBODIMENTS

Figure 1:
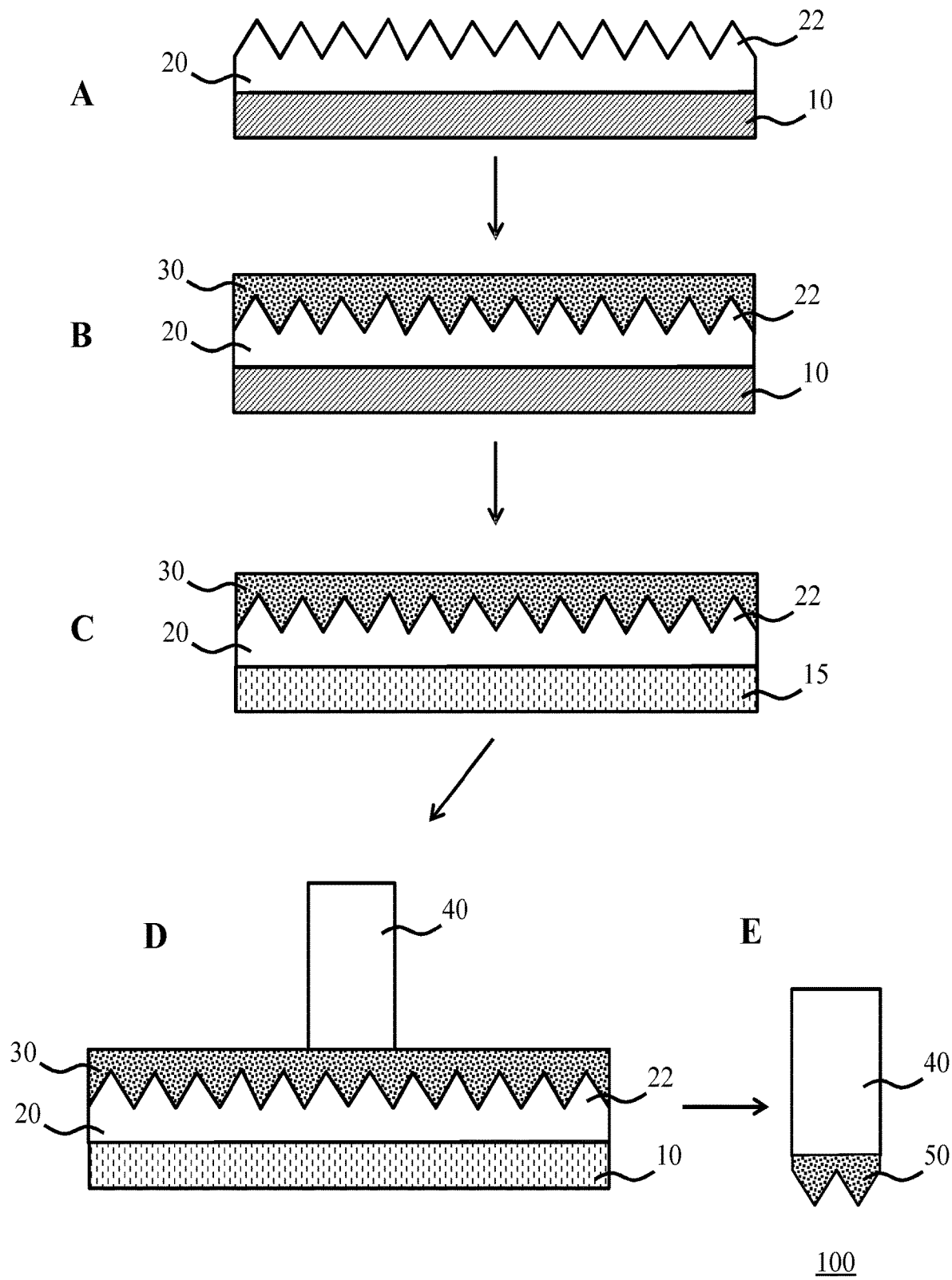
FIG. 1 schematically depicts a method of forming an imprinted layer according to an embodiment.

It should be understood that the Figures are merely schematic and are not drawn to scale. It should also be understood that the same reference numerals are used throughout the Figures to indicate the same or similar parts.

Embodiments of the present invention provide ink compositions for forming patterned layers through imprinting techniques such as Substrate Conformal Imprint Lithography (SCIL) in which a stamp having a patterned surface, typically a surface carrying a pattern of features of µm and/or nm dimensions, is brought into contact with such an ink composition. The ink composition typically comprises polymerizable content dissolves or suspended in a solvent system, which may be a single solvent or a mixture of solvents, as well as optionally comprising stabilizers, PH tuning agents, film forming enhancers, and so on.

In the context of the present application, polymerizable content is intended to cover both particles having reactive surface groups that can react to form a network of particles interlinked by the reacted surface groups as well as monomeric or oligomeric molecules that can form any suitable type of polymer, e.g. polymer networks.

The patterned layers formed by such imprinting techniques are typically formed by concentrating the polymerizable content in the imprinting ink compositions, which initiates or accelerates the formation of the desired polymer structures, e.g. 3-D networks. This concentrating for instance may shift equilibrium reactions between monomeric and polymeric sides of the reaction equation, e.g. polycondensation/solvolysis equilibria, towards the polymeric side of the equilibrium. The concentration of the polymerizable content may be achieved by diffusion of the solvent and additives in the imprinting ink composition into the imprinting stamp. This therefore typically requires the use of solvents and additives having suitable polarity and molecular sizes, i.e. small molecules, to facilitate such diffusion processes into a stamp material. For example, where a polysiloxane stamp such as a PDMS stamp is used, the imprinting ink composition preferably contains polar solvents and additives to facilitate the concentration of the polymeric content during the imprinting process in order to form the desired patterned layers.

According to embodiments of the present invention, imprinting ink compositions are provided that are suitable for imprinting techniques such as SCIL and can generate patterned layers of high refractive index by the presence of TMO nanoparticles in relatively high amounts without such amounts causing premature polymerization of the TMO nanoparticles, which can for example lead to gelation of the imprinting ink composition making it unsuitable for imprinting. This is achieved by adding stabilizers to the imprinting ink compositions that inhibit the polymerization of the TMO nanoparticles but can be readily removed from the surface of the TMO nanoparticles by diffusion into a stamp material of a patterned stamp used to imprint layers formed of the imprinting ink compositions.

In an embodiment, at least 80% of the polymeric content consists of TMO nanoparticles. The synthesis of such nanoparticles invariably leads to the presence of reactive surface groups on the surfaces of such nanoparticles, which reactive surface groups can react with each other to form 3-D networks of the TMO nanoparticles. Suitable TMO nanoparticles include $TiO_2$, $ZrO_2$, $HfO_2$, $Ta_2O_3$, $V_2O_3$, $Nb_2O_3$, $Y_2O_3$, $Fe_2O_3$, $BaTiO_3$ and $SrTiO_3$ nanoparticles, with anatase and rutile $TiO_2$ nanoparticles being particularly suitable. Rutile $TiO_2$ nanoparticles are particularly preferred because particularly high quality imprinting layers may be formed from such nanoparticles but each of the other example TMO nanoparticles may be contemplated. At least 85%, 90% or 95% of the polymeric content may consist of TMO nanoparticles. In an embodiment, the polymeric content entirely consists of TMO nanoparticles.

The total fraction of the polymeric content in the imprinting ink composition may be in the range of 2-25% by weight based on the total weight of the imprinting ink composition. For larger fractions, it may be difficult to avoid premature polymerization of TMO nanoparticles, leading to gelation of the imprinting ink composition. For this reason, the upper end point of this range may be lowered to 20% by weight, 15% by weight or even 10% by weight based on the total weight of the imprinting ink composition. In a preferred embodiment, the total fraction of the polymeric content in the imprinting ink composition is in the range of 5-15% by weight based on the total weight of the imprinting ink composition.

In an embodiment, the transition metal oxide nanoparticles have a particle size distribution from a lower value ranging from 1-10 nm to an upper value ranging from 20-40 nm. For example, the lower value of the particle size distribution range may be 1, 2, 3, 4, 5, 6, 7, 8, 9 or 10 nm and the upper value of the particle size distribution range may be 20, 21, 22, 23, 24, 25, 26, 27, 28, 29 30, 31, 32, 33, 34, 35, 36, 37, 38, 39 or 40 nm. Any combination of the specified lower and upper range values may be made to provide a particle size distribution falling under the scope of this embodiment. In a particularly preferred embodiment, the particle size distribution range is 15-30 nm. For the avoidance of doubt, where reference is made to a particle size, this includes spherical particles in which the particle size is the diameter of the particle as well as non-circle particles in which the largest cross-section of the particle is its particle size. Moreover, where reference is made to a size distribution, this means that at least 80% and preferably at least 90% of the nanoparticles have a size within the given size distribution. In other words, each size distribution may contain a small amount of outliers and where reference is made to a size distribution it is to be understood that not every single nanoparticle necessarily falls within the given size distribution.

Having TMO nanoparticles of different sizes within a particular particle size distribution has the advantage that a particularly good or dense packing of nanoparticles is obtained in the layer formed from the imprinting ink composition comprising such nanoparticles, as smaller particles can fill the voids in between the larger particles in such a distribution. If larger nanoparticles, e.g. nanoparticles larger than 40 nm, are being used, the integrity of the layer formed from the imprinting ink composition deteriorates, leading to ill-defined patterns. This is equally the case when TMO nanoparticles of different sizes in a size distribution range having a lower value in excess of 40 nm, e.g. a particle size distribution range of 50-70 nm, is used.

The TMO nanoparticles may be stabilized by a polymerization inhibitor according to any of Formulae 1-3:

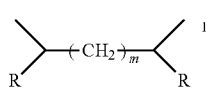

Formula 1 wherein in Formula 1, $R_1$ is hydrogen, $C_1$-$C_4$ alkyl or —(—$C_2H_5$—O—)$_n$—$R_{13}$, wherein n is 1, 2 or 3 and $R_{13}$ is a $C_1$-$C_3$ alkyl; $R_2$ and $R_3$ individually are selected from hydrogen or $C_1$-$C_4$ alkyl and m is 0, 1, 2 or 3;

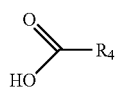

Formula 2 wherein in Formula 2, $R_4$ is hydrogen, methyl or ethyl;

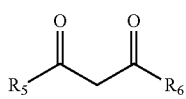

Formula 3 wherein in Formula 3, $R_5$ and $R_6$ are individually selected from hydrogen and $C_1$-$C_3$ alkyl.

Polymerization inhibitors according to Formula 1 are preferably included in the imprinting ink composition in a range of 0.1-3.0% by weight, more preferably 0.3-2.0% by weight based on the total weight of the imprinting ink composition. Specifically mentioned are 1,2-propanediol, ethylene glycol, and 2-(2-ethoxyethoxy) ethanol (EEOL) as examples of suitable polymerization inhibitors falling under the definition of Formula 1. Polymerization inhibitors according to Formula 2 are preferably included in the imprinting ink composition in a range of 0.7-7.0% by weight, more preferably 5.0-7.0% by weight based on the total weight of the imprinting ink composition. Specifically mentioned is acetic acid as an example of a suitable polymerization inhibitor falling under the definition of Formula 2.

Polymerization inhibitors according to Formula 3 are preferably included in the imprinting ink composition in a range of 0.7-7.0% by weight by based on the total weight of the imprinting ink composition. Specifically mentioned is acetyl acetone as an example of suitable polymerization inhibitors falling under the definition of Formula 3. Generally, without wishing to be bound by theory, it is assumed that the hydroxy groups or carboxylic acid groups in the polymerization inhibitors reversibly bind with the reactive surface groups of the TMO nanoparticles, thus preventing the reactive surface groups from reacting with each other and forming the 3-D TMO nanoparticle networks. It is pointed out for the avoidance of doubt that the compounds of Formula 3 typically exist in two tautomeric forms, i.e. a keto form and an enol form:

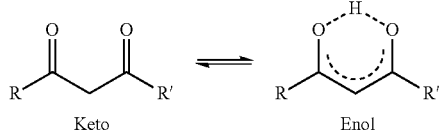

Keto          Enol

It is believed that in the imprinting ink compositions according to embodiments of the present invention, the enol form of the compounds of Formula 3 provide the capability of these compounds to inhibit the polymerization of the TMO nanoparticles.

The pH of the imprinting ink compositions according to embodiments of the present invention is preferably acidic, more preferably below 3 to reduce the risk of premature polymerization of the TMO nanoparticles. In embodiments where a polysiloxane matrix precursor is also present, such pH has the additional advantage of shifting the equilibrium of the polycondensation reactions from which such a matrix is formed towards the monomeric side of such reactions. Depending on the starting pH of the imprinting ink composition, this may be achieved by addition of a suitable acid or base to the imprinting ink compositions, such as an acid according to Formula 2. Non-limiting examples of other suitable acids include formic acid, acetic acid and propionic acid. Suitable bases include ammonia, methyl-amine, ethyl-amine, ethanol-amine, di-ethanol-amine (DEA) and, tri-ethanol-amine (TEA). DEA and TEA are particularly suitable as they exhibit a high boiling point, which would permit the formation of a stable acidic sol system that increases in pH during coating and evaporation of the solvents, where the low vapor pressure of DEA or TEA would cause these amines to be concentrated in the layer and increase the pH with ongoing evaporation of the solvents.

In some embodiments, the imprinting ink composition may be formed using a stock solution of polymer matrix precursors, such as polysiloxane precursors as will be explained in further detail below. As explained above, in order to suppress premature polycondensation of these precursors, such a stock solution may be kept at a low pH, for example a pH of less than 1. A further advantage of such a low pH is that premature polymerization of the TMO nanoparticles is effectively suppressed, but such acidic imprinting ink compositions may not be compatible with certain type of substrates, e.g. silicon substrates, and may reduce the lifetime of the patterned stamps used to create the patterned layers from the imprinting ink compositions, e.g. PDMS stamps. In an embodiment, the imprinting ink composition further comprises ammonia to increase the pH of the composition to a range of 1-3 to increase compatibility of the imprinting ink composition with such substrates. To this end, an 1.0-2.0 wt % ammonia solution may be included in the imprinting ink composition in a range of 10-40% by weight by based on the total weight of the composition. Where ammonia is being added to the imprinting ink compositions, it is preferred that a polymerization inhibitor of Formula 1 is used to further reduce the risk of gelation of the imprinting ink composition. 1,2-propanediol and EEOL for example are suitable polymerization inhibitors for combining with ammonia in the imprinting ink composition. As explained above, ammonia may be replaced by any other suitable base, most notably DEA or TEA.

In an embodiment, the polymeric content of the imprinting ink composition consists entirely of TMO nanoparticles. However, in an alternative embodiment, the polymeric content of the imprinting ink composition further comprises up to 20% by weight of a polymer matrix precursor based on a total weight of the polymerizable content. Such a polymer matrix precursor may form a network interleaving the 3-D network formed by polymerizing the TMO nanoparticles, which increases the density of a patterned layer formed from such an imprinting ink composition due to the fact that air in between the networked TMO nanoparticles is replaced by the polymer matrix. This therefore further increases the refractive index of the patterned layer.

In a preferred embodiment, the polymer matrix precursor is a polysiloxane precursor as it has been well-established that polysiloxanes are particularly suitable as network formers in imprinting techniques such as SCIL. The polysiloxane precursor may be a precursor comprising at least one monomeric unit according to Formula 5:

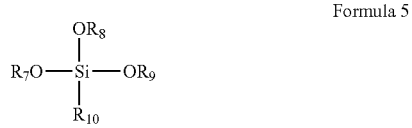

Formula 5 wherein $R_7$-$R_9$ are individually selected from $C_1$-$C_3$ alkyl; and $R_{10}$ is selected from $C_1$-$C_3$ alkyl, $C_1$-$C_3$ alkoxy and $-(CH_2)_n NHR_{11}$, wherein $R_{11}$ is selected from hydrogen and $-(CH_2)_m NH_2$, wherein m and n are individually selected from 2, 3 and 4.

Alkoxysilanes may be used which undergo the reaction steps as shown in reaction scheme I in the presence of an acid or a base. Reaction scheme I shows the acid-catalyzed reaction. The alkoxysilanes undergo a hydrolysis, which is followed by a condensation reaction between two hydrolyzed alkoxysilanes (water condensation reaction) or between a hydrolyzed alkoxysilane and an unreacted alkoxysilane (alcohol condensation reaction) in which the cross-linked inorganic network is formed. The degree of cross-linking can be controlled by appropriate choice of the alkoxysilanes, pH, reaction temperature and solvent system.

Reaction Scheme I

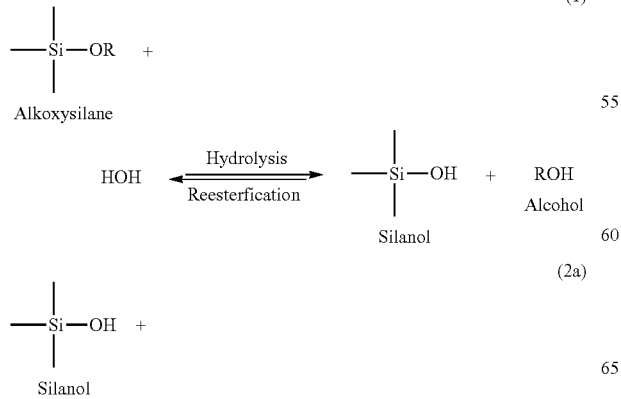

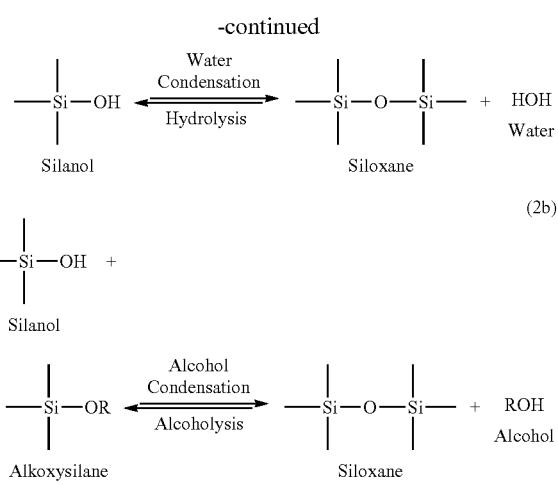

In the above reaction scheme, the equilibrium point between condensation and hydrolysis or alcoholysis can be controlled by the pH of the ink composition. A lower pH, i.e. a more acidic imprinting ink composition, will typically shift the equilibrium towards hydrolysis. Particularly suitable polymer matrix precursors include one or more monomers according to Formulae 6-11:

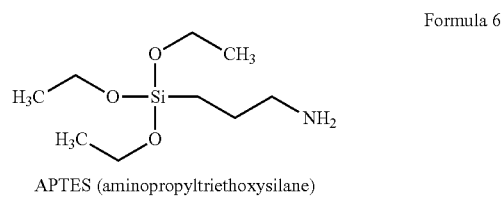

Formula 6

APTES (aminopropyltriethoxysilane)

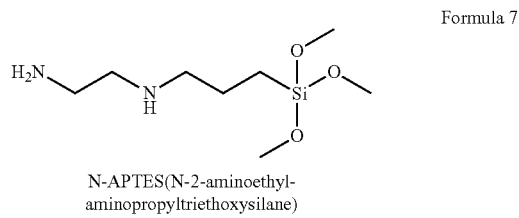

Formula 7

N-APTES (N-2-aminoethyl-aminopropyltriethoxysilane)

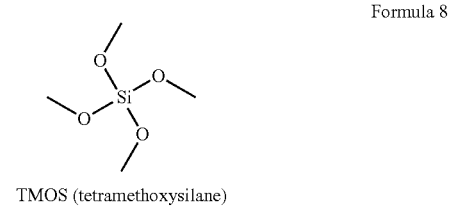

Formula 8

TMOS (tetramethoxysilane)

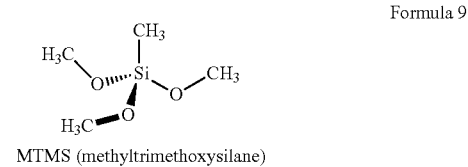

Formula 9

MTMS (methyltrimethoxysilane)

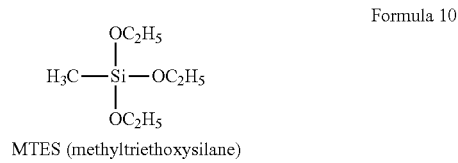

Formula 10

MTES (methyltriethoxysilane)

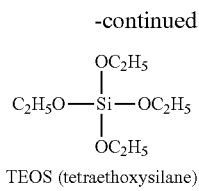

TEOS (tetraethoxysilane)

Polymer matrix precursors of Formulae 6-9 are particularly preferred. The polymer matrix precursor may be an oligomer of about 2-20 of the above monomers, which may be a mixture of such monomers, as will be explained in more detail below.

In an embodiment, the imprinting ink composition may comprise oligomers formed from the silane monomers of Formula 12, Formula 13 or a combination thereof:

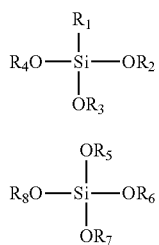

wherein $R_1$-$R_8$ are individually selected from the group consisting of $C_1$-$C_6$ linear or branched alkyl groups and a phenyl group. Particularly suitable examples of such silane compounds are defined by the compounds of Formulae 8-11, with the polymer precursors of Formulae 8 and 9 being particularly preferred.

In an embodiment, the imprinting ink composition comprises oligomers based on a first silane compound of Formula 12 and a second silane compound of Formula 13, e.g. the polymer precursors of Formulae 8 and 9. This has the advantage that the amount of crosslinking can be controlled by varying the ratio between the first and second curable compound. Typically, an increase in the ratio towards the first curable compound reduces the crosslinking density in the network formed in the polycondensation reaction. In order to obtain the most desirable cross-linking density, the molar ratio of the first silane compound and the second silane compound is in the range of 5:1-1:5. A particularly good cross-linking density is achieved if the molar ratio of the first silane compound and the second silane compound is in the range of 2:3-5:1. It is noted for the avoidance of doubt that the exact cross-linking density may be difficult to determine due to the presence of the TMO particles in the polymer matrix. However, previous experiments in the absence of TMO particles have determined that the above range is particularly suitable to achieve a favourable cross-linking density.

The solvent in the imprinting ink composition preferably is a polar solvent to facilitate good interaction with the TMO particles. Proper wetting of the PDMS stamp is achieved when the contact angle of the final TMO—solvent layer has a contact angle of <90° on PDMS. In the context of the present application, a solvent may be a single solvent or a solvent system comprising a mixture of solvents. In an example embodiment, the polar solvent is at least one of water and/or methanol. The solvent system may further comprise a co-solvent, for example to improve the deposition characteristics of the imprinting ink composition and/or reduce or prevent dewetting on a deposition surface, e.g. a substrate surface or a stamp surface. A non-limiting example of such a co-solvent is propoxyethanol. The co-solvent may be included in the imprinting ink composition in an amount up to 40% by weight based on the total weight of the imprinting ink composition, more preferably in an amount up to 20% by weight based on the total weight of the imprinting ink composition. A solvent system consisting of methanol and propoxyethanol is specifically mentioned.

The imprinting ink composition may further comprise a luminescent compound, e.g. a phosphor or luminescent dye, to provide an optical element that can modify the spectral composition of light with which the optical element interacts, e.g. for instance when optically or physically engaging with a semiconductor substrate carrying light-emitting elements such as light-emitting diodes. Other suitable additives will be apparent to the skilled person.

Next, an embodiment of a method of forming a patterned layer having a high refractive index using an imprinting ink composition according to one or more embodiments described above will be explained with the aid of FIG. 1, which schematically depicts such a method.

In step A, a substrate 10 is provided as a support for an elastomeric stamp 20 having a major surface carrying a pattern 22. The features of the pattern 22 typically have μm or nm dimensions, i.e. widths and heights of such dimensions. The pattern 22 may be formed in any suitable manner, for example by creating at least the patterned surface of the elastomeric stamp 22 in a master mould as is well-known per se. The elastomeric stamp 20 preferably is permeable such that targeted constituents of the imprinting ink composition can diffuse into the stamp material and may be made of any suitable elastomeric material, e.g. a polysiloxane such as PDMS or another rubber-like stamp material having a low Young's modulus or having a suitably high permeability for water, alcohols and solvents, such as PFPE (Acryloxy Perfluoropolyether). A suitable Young's modulus for example lies within the range of 2-100 MPa. For the avoidance of doubt it is noted that the reported Young's moduli have been determined by a standardized hardness test according to the ASTM D1415-06(2012) standard by penetrating the rubber material with a rigid ball under the conditions mandated by the standard. The elastomeric stamp 20 may be made from a bulk material or may be built up in layers. The elastomeric stamp 20 may be placed on the substrate 10 such that its patterned surface is exposed, as shown in step A. Any suitable substrate 10 may be used for this purpose, e.g. a glass substrate, a semiconductor substrate such as a silicon substrate, sapphire, and so on.

In step B, an imprinting ink composition 30 according to an embodiment of the present invention is deposited over the pattern 22 of the elastomeric stamp 20 using any suitable deposition technique, such as blading, printing or spin coating by way of non-limiting example. As previously explained, besides the evaporation of solvents to the environment, the interaction between the imprinting ink composition 30 and the elastomeric stamp 20 will initiate the polymerization of the polymeric content in the imprinting ink composition 30, due to the diffusion of the one or more solvents, acid and/or polymerization inhibitor of Formula 1, 2 or 3 into the elastomeric stamp material, thereby concentrating the polymeric content in the imprinting ink composition 30 on the pattern 22, which shifts the equilibrium of the polymerization reactions towards polymerization as previously explained.

In an optional step C, at this stage the substrate 10 may be replaced by a foam 15 to increase the absorption capacity of the elastomeric stamp 20, as the components diffusing from the imprinting ink composition 30 into the stamp reservoir may further be stored in porous of the foam 15. Foams are preferred as they have an open pore structure. Any suitable type of foam, e.g. polyurethane foam, may be used for this purpose. Alternatively, the absorption capacity of the stamp can be tuned by incorporating layers of different materials which absorb more solvents or using a SCIL stamp layout in which a non-permeable back-plate material such as glass is replaced by a more permeable polymer or a perforated plate.

Step D is another optional step in which a body 40 such as an optical body, e.g. a light guide or the like, is placed on the imprinting ink composition 30. This for instance may be used in order to provide an optical element 100 in which the patterned layer consisting mainly or exclusively of a TMO nanoparticles network as formed from the imprinting ink composition 30 is used as an optical layer on the body 40. For example, the patterned layer may act as a refractive layer or out-coupling layer on the body 40 in order to shape a luminous output from light coupled into the body 40. By curing the imprinting ink composition 30 in order to form a patterned layer 50, i.e. by forming the polymer networks from the imprinting ink composition 30, the patterned layer 50 will be adhered to the body 40, for instance to yield an optical element 100 as shown in step E.

The curing of the imprinting ink composition 30 may be performed at room temperature (about 25° C.) without additional stimuli. Alternatively, to accelerate the curing the temperature to which the imprinting ink 30 on the elastomeric stamp 20 is exposed may be increased to a temperature in the range of 30-120° C. for a period of 10-60 minutes. Optionally, the imprinting ink composition 30 may be subjected further stimuli, e.g. optical stimuli such as UV radiation. This for instance may be advantageous if the imprinting ink composition 30 comprises polymerizable content in addition to the TMO nanoparticles, e.g. polysiloxane precursors.

In at least some embodiments, before or after releasing the elastomeric stamp 20 from the cured imprinted layer, the cured imprinted layer may be subjected to a (post-) curing step at elevated temperatures, for example to release residual volatile compounds, e.g. solvents, from the cured imprinted layer to further densify this layer and increase its refractive index. For example, in other to obtain a refractive index (at 400-800 nm) in the range of about 1.7-2.0, the cured imprinted layer may be post-cured at about 80-120° C. such as around 90° C. for a period of about 10-60 minutes. Curing or post-curing at higher temperatures can further increase the refractive index of the cured imprinted layer; for example, post-curing at a temperature of about 250-350° C., such as around 300° C., for about 10 to 60 minutes has been demonstrated to yield imprinted layers having a refractive index (at 400-800 nm) in the range of about 2.3-2.5.

Figure 2:
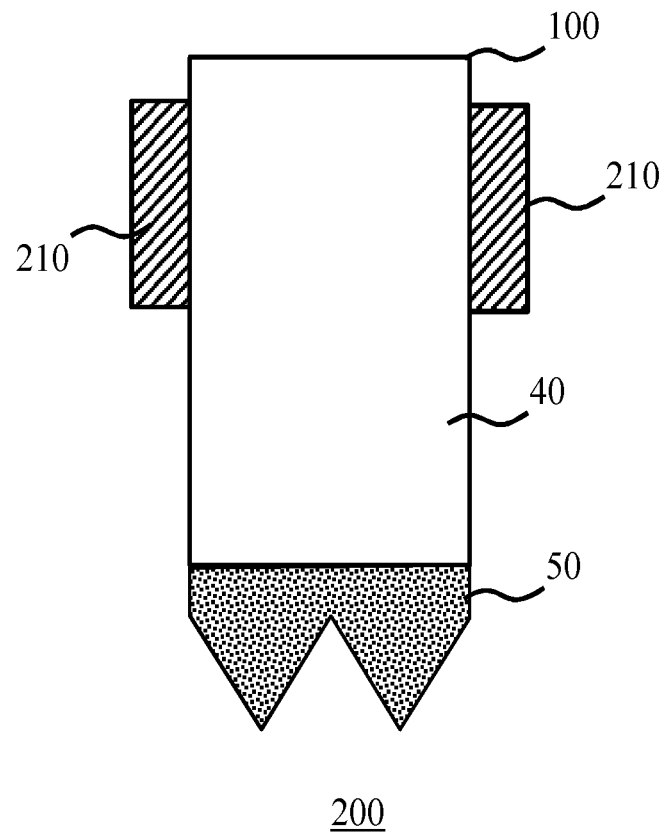
FIG. 2 schematically depicts a lighting device according to an embodiment.

FIG. 2 schematically depicts a lighting device 200 comprising an optical element 100 according to an example embodiment. The optical element 100, here a light guide, is optically coupled to a number of solid state lighting elements 210, e.g. LEDs. The optical coupling ensures that the light emitted by the solid state lighting elements 210 is coupled into the light guide body 40 and directed towards the patterned layer 50 formed from the imprinting ink composition 30, with the patterned layer 50 causing the light travelling through the light guide body 40 to be coupled out of the light guide body 40. The solid state lighting elements 210 may be LEDs of any suitable colour or combination of colours, e.g. white LEDs, blue LEDs, green LEDs, and so on.

In an example embodiment, the lighting device 200 is a projection device in which the patterned layer 50 is arranged to concentrate (collimate) the light exiting the light guide body 40 in order to generate a collimated light beam. This yields a particularly compact collimator compared to for instance compound parabolic concentrators that are commonly used for this purpose. The projection device may comprise a plurality of modules for generating a light beam of a primary colour, which might beams may be combined onto a projection lens to generate a colour image as is well-known per se. At least one of such modules may comprise the optical element 100 in order to generate the collimated light beam. In an embodiment, the optical element 100 is further configured as a wavelength conversion element, for instance to convert light from blue LEDs into green light (e.g. about 450 nm to about 500 nm conversion). The lighting device 200 alternatively may form a light rod in which the optical element 100 acts as a light guide and optionally further acts as a wavelength conversion element.

The patterned layer 50 according to embodiments of the present invention exhibits a high refractive index across the visible part of the electromagnetic spectrum, typically a refractive index in excess of 1.7, 1.8 or even 1.9 depending on the TMO nanoparticle content and density of the patterned layer 50, which may be controlled by an optional (post-)curing step as explained above. This makes it possible to match the patterned layer 50 to other materials in terms of refractive index, such as for instance yttrium aluminium garnets, e.g. doped yttrium aluminium garnets such as cerium-doped YAG, which is commonly used as a light guide material, e.g. as a light guide body 40 that additionally act as a wavelength conversion material (i.e. a phosphor). The high refractive index of Ce:YAG (~1.83) ensures total internal reflection within the light guide body 40, as is well known per se.

Figure 3:
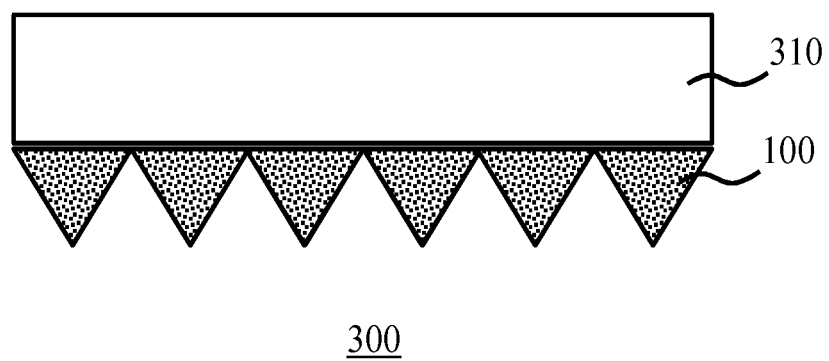
FIG. 3 schematically depicts a lighting device according to another embodiment.

It should be understood that many other embodiments of an optical element 100 are equally feasible. FIG. 3 for example schematically depicts another example embodiment in which the optical element 100 is optically coupled, e.g. in physical contact with, a solid state lighting chip or package 310, e.g. a LED chip or package, wherein the optical element 100 is configured as a lens element or collimator to yield a lighting device 300 such as a light bulb or the like.

The optical element 100 may be integrated in other types of devices, e.g. other types of electronic devices. For example, the optical element 100 may form part of an optical sensor in which the optical element 100 for instance may be used as a light-harvesting layer of the optical sensor.

Alternatively, the optical element 100 may form part of a photovoltaic device such as a solar cell or solar panel, which photovoltaic device typically comprises one or more photovoltaic cells for converting light into electricity. In such a device, the optical element 100 for instance may be used as an in-coupling layer for the one or more photovoltaic cells, for example a patterned $TiO_2$ layer of a flat silicon substrate acting as a light trapping layer. Such light trapping layers are known per se, as for instance explained by Spinelli et al. in Applied Phyics Letters, 102, 233902 (2013) and will therefore not be explained in further detail for the sake of brevity only. It is noted for the avoidance of doubt that the patterned light trapping layer (antireflection coating) such as in this citation can be produced in a single step process with the imprinting ink composition and imprinting method according to embodiments of the present invention.

It is reiterated that the optical element 100 is not limited to the aforementioned embodiments; any embodiment in which an appropriately dimensioned patterned layer 50 may be used to interact with light in a predetermined manner may be considered. Examples of such optical elements include lenses, light scattering elements, collimators, in-coupling elements, waveguides, photonic devices such as ring resonators, wavelength filters, amplitude modifiers, and so on. Other embodiments will be apparent to the skilled person. It is furthermore noted that the optical element 100 may be integrated in devices that in lighting devices, e.g. electronic devices, energy harvesting devices such as solar panels, where the optical element may be used as an in-coupling device, and so on.

Figure 4:
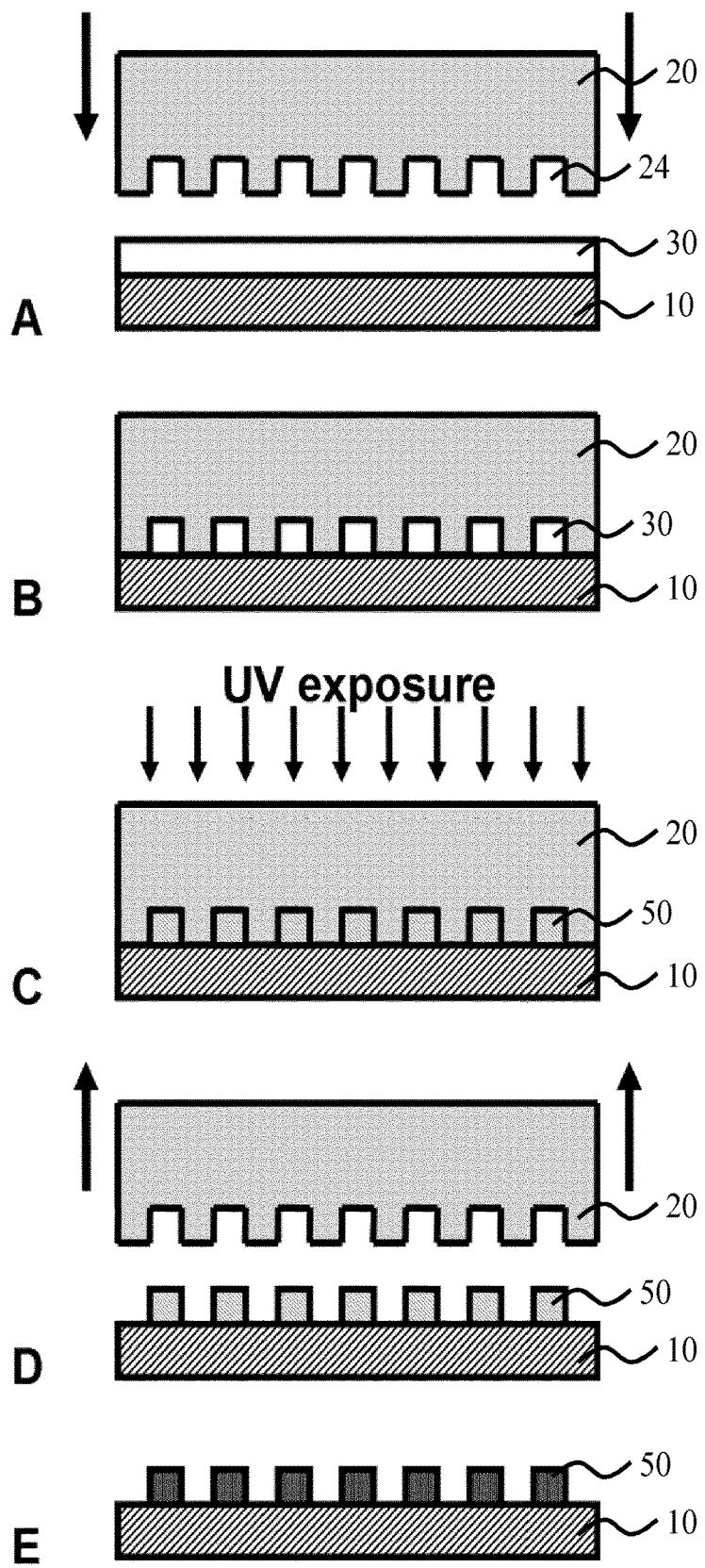
FIG. 4 schematically depicts a method of forming an imprinted layer according to another embodiment.

An alternative embodiment of the method of the present invention is schematically depicted in FIG. 4. In step A, a substrate 10, which may be any suitable substrate, e.g. a semiconductor substrate such as a silicon substrate, a SiGe substrate, a silicon on insulator substrate, a GaAs substrate and so on, is covered with a layer of a curable imprinting ink 30 according to an embodiment of the present invention. The curable imprinting ink 30 may be applied in any suitable manner although spin coating is specifically mentioned as layers of substantially uniform thickness can be achieved in this manner. Additionally ink jet printing and subsequent imprinting yields uniform layers due to the capillary forces, e.g. due to surface tension of polar solvents after dispensing the droplets as well as underneath the stamp, causing the redistribution of the imprinting ink material to obtain a uniform thickness.

An elastomeric stamp 20 having a major surface carrying a pattern 22 is imprinted into the curable imprinting ink composition 30, thereby transferring the pattern 22 into this layer, as shown in step B. The features of the pattern 22 typically have μm or nm dimensions, i.e. widths and heights of such dimensions. The pattern 22 may be formed in any suitable manner, for example by creating at least the patterned surface of the elastomeric stamp 22 in a master mould as is well-known per se. The elastomeric stamp 20 preferably is permeable and may be made of any suitable elastomeric material, e.g. a polysiloxane such as PDMS or another rubber-like stamp material having a low Young's modulus or having a suitably high permeability for water, alcohols and solvents, such as PFPE (Acryloxy Perfluoropolyether). The elastomeric stamp 20 may be made from a bulk material or may be built up in layers of varying Young's' modulus.

Next, as depicted in step C, the imprinted layer of the imprinting ink composition 30 is cured, which optionally may comprise the application of a stimulus such as heat and/or UV radiation as previously explained.

Upon completion of the polymerization reaction(s) in the imprinted layer of the imprinting ink composition 30, the elastomeric stamp 20 is released from this layer in step D, leaving behind the patterned layer 50 on the substrate 10, which retains its shape due to the network formed by the polymerization, e.g. polycondensation, reaction(s). The patterned layer 50 may be densified further, e.g. by exposure to heat, e.g. to remove remaining solvent(s) and polymerization inhibitor, thereby forming patterned layer 50 formed of the polymeric content of the imprinting ink composition 30 consisting of at least 80% by weight of a TMO nanoparticles 3-D network as previously explained.

Figure 5:
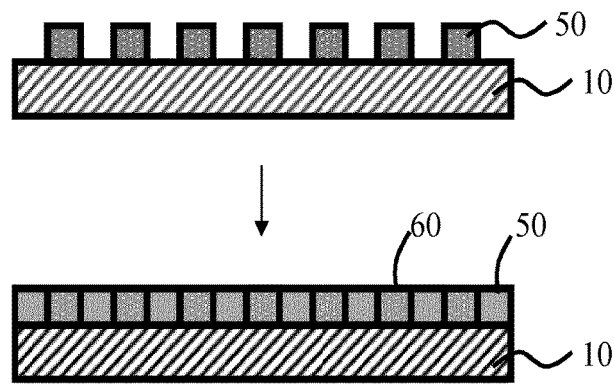
FIG. 5 schematically depicts an aspect of a method of forming an imprinted layer according to a further embodiment.

The method as schematically depicted in FIG. 4 may be used to form three-dimensional structures built up from patterned layers 50. Such three-dimensional structures may be produced by filling or planarizing the patterned layer 50 by depositing a sacrificial planarization material 60 over the patterned layer 60, as shown in FIG. 5, and removing excess material if necessary, e.g. by etching or polishing. The sacrificial planarization material 60 preferably is a thermally degradable material, and may be any suitable thermally degradable material such as a thermally degradable polymer (TDP). A non-limiting example of a TDP is polynorbornene or polystyrene. Alternatively, the sacrificial planarization material 60 may be soluble in a particular solvent. In general, any sacrificial planarization material 60 that can be selectively removed from a formed multi-layer structure without damaging the patterned layers 50 formed from the curable imprinting ink composition 30 according to an embodiment of the present invention may be used.

Figure 6:
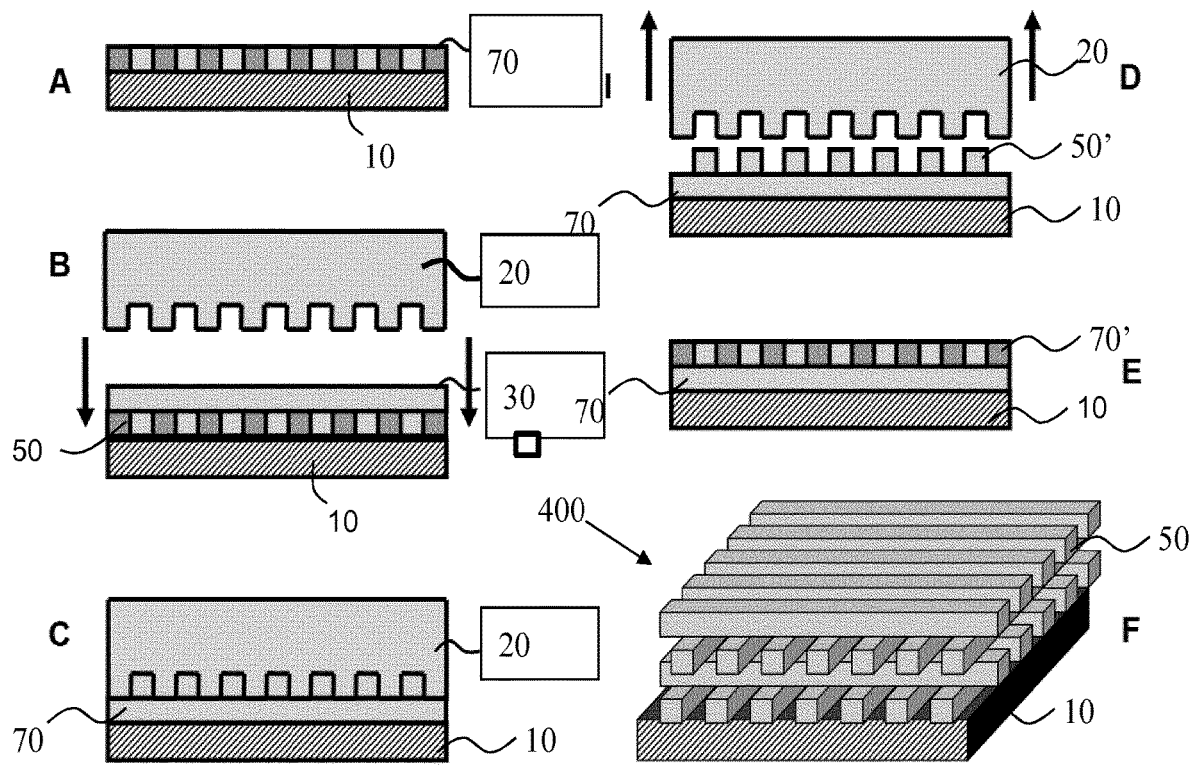
FIG. 6 schematically depicts a method of forming an imprinted layer according to a further embodiment.

A non-limiting example of a method of manufacturing such a three-dimensional structure is shown in FIG. 6. In step A, a planarized layer 70 is formed on a substrate or carrier 10, as previously explained. The patterned layer portion 50 of the planarized layer 30 may be produced by imprint lithography (Substrate Conformal Imprint Lithography, SCIL) using the curable imprinting ink composition 30 in accordance with the method shown in FIG. 4. The patterned layer 50 is filled, i.e. planarized with a sacrificial filling material 60 as previously explained with the aid of FIG. 5 In step B, a next layer of the curable imprinting ink composition 30 according to an embodiment is applied over the planarized layer 70 of step A in any suitable manner, e.g. by spincoating, dispensing or doctor blading.

The curable imprinting ink composition 30 deposited in step B is subsequently embossed by a suitably patterned elastomeric stamp 20 after alignment of the stamp with respect to the substrate 10, as shown in step C. In step C, the imprint orientation of the stamp 20 with the substrate 10 has been rotated 90° with respect to the imprint orientation used to form the first patterned layer 50. It will be appreciated that other orientation rotation angles are equally feasible.

The curable imprinting ink composition 30 is subsequently solidified (densified), e.g. as shown in FIG. 4 to form a further patterned layer 50' as shown in step D. Obviously, the formation of the further patterned layer 50' may be completed after removal of the patterned elastomeric stamp 20, i.e. by completing the polymerization reaction(s) as previously discussed. Removing the patterned elastomeric stamp 20 leaves the further patterned layer 50' on the planarized layer 70 of step A. The newly formed patterned layer 50' may again be planarized as shown in step E to form a further planarized layer 70', after which additional layers may be formed by repeating the steps B-E. The height of the patterned portions of the patterned layers 50, 50' may be reduced using an additional processing step, e.g. by means of reactive ion etching.

The sacrificial planarizing material 60 may be removed afterwards by e.g. dissolving the sacrificial planarizing material 60 in a suitable solvent or by thermal decomposition, thus yielding an optical device 400 in the form of a stacked structure as shown in step F. The imprinting ink composition 30 is particularly suitable for application in this method because it can withstand most solvents required to dissolve the sacrificial planarizing material 60, as well as withstand high temperatures up to 600 or even 1000° C., thereby making it particularly suitable for use with sacrificial planarizing materials 60 in the form of thermally degradable compounds such as a TDP.

In any of the aforementioned embodiments may it be necessary to remove residual imprint structures from e.g. the substrate 10, for instance when a layer on the substrate 10 has been patterned using the imprint structures as a mask. The imprint structures may be removed by any suitable etching technique, e.g. reactive ion etching. The present invention will now be explained in more detail by way of the following non-limiting examples.

Example 1

An imprinting ink composition of total weight of 20 grams was obtained by mixing 15% acidified aqueous dispersion of anatase $TiO_2$ nanoparticles (from Nanoamor, http://www.nanoamor-europe.com/nanomaterials/nanoparticles/single-metal-oxides/tio2-nanopowders/titaniumoxide5420ht.html) having a size distribution of 5-30 nm in an amount of 9.0% by weight based on the total weight of the imprinting ink composition as the polymeric content and EEOL as a polymerization inhibitor in an amount of about 0.4% by weight based on the total weight of the imprinting ink composition. The pH of this composition was adjusted to 2.0-2.5 by adding an 1.3% ammonia solution (in methanol) in an amount of 37% by weight based on the total weight of the imprinting ink composition and spin-coated at 1000 rpm onto a silicon wafer. The thus formed layer was subsequently (post-)cured at 90° C. for 30 minutes.

Example 2

Example 1 was modified by increasing the amount of EEOL as a polymerization inhibitor to about 0.7% by weight based on the total weight of the imprinting ink composition.

Example 3

Example 1 was modified by replacing EEOL as a polymerization inhibitor with 1,2 propanediol in an amount of about 0.6% by weight based on the total weight of the imprinting ink composition.

Examples 4-6

Examples 1-3 were modified by replacing the 15% acidified aqueous dispersion of anatase $TiO_2$ nanoparticles with an 15% acidified aqueous dispersion of rutile $TiO_2$ nanoparticles having a size distribution of 5-30 nm in an amount of 9.0% by weight based on the total weight of the imprinting ink composition as the polymeric content to yield examples 4-6 respectively.

Example 7

Example 6 was modified by adjusting the amount of 1,2 propanediol to about 0.4% by weight based on the total weight of the imprinting ink composition.

Examples 8-14

Examples 1-7 were modified by replacing 1.3% ammonia solution in methanol with 1.2% ammonia solution in water as base in the same amounts as examples 1-7 to yield examples 8-14 respectively.

Example 15

An imprinting ink composition of total weight of 20 grams was obtained by mixing methanol and 7% by weight based on the total weight of the imprinting ink composition of 1-propoxyethanol as a solvent, an 15% acidified aqueous dispersion of rutile $TiO_2$ nanoparticles having a size distribution of 5-30 nm in an amount of 7% by weight based on the total weight of the imprinting ink composition as the polymeric content and EEOL as a polymerization inhibitor in an amount of about 0.7% by weight based on the total weight of the imprinting ink composition. The pH of this composition was adjusted to 2.0-2.5 by adding an 1.3% ammonia solution (in methanol) in an amount of 31% by weight based on the total weight of the imprinting ink composition and spin-coated at 1000 rpm onto a silicon wafer. The thus formed layer was subsequently cured at 90° C. for 30 minutes.

Example 16

Example 15 was modified by increasing the amount of EEOL as a polymerization inhibitor to about 1.8% by weight based on the total weight of the imprinting ink composition.

Example 17

Example 15 was modified by replacing EEOL as a polymerization inhibitor with 1,2-propanediol in an amount of about 0.4% by weight based on the total weight of the imprinting ink composition.

Example 18

Example 17 was modified by increasing the amount of 1,2-propanediol as a polymerization inhibitor to about 0.8% by weight based on the total weight of the imprinting ink composition.

Example 19

Example 17 was modified by increasing the amount of 1,2-propanediol as a polymerization inhibitor to about 1.4% by weight based on the total weight of the imprinting ink composition.

Example 20

Example 15 was modified by increasing the amount of 1-propoxyethanol as a co-solvent to about 14% by weight based on the total weight of the imprinting ink composition and by adjusting the amount of EEOL to about 0.3% by weight based on the total weight of the imprinting ink composition.

Example 21

Example 20 was modified by increasing the amount of EEOL as a polymerization inhibitor to about 0.7% by weight based on the total weight of the imprinting ink composition.

Example 22

Example 20 was modified by increasing the amount of EEOL as a polymerization inhibitor to about 1.4% by weight based on the total weight of the imprinting ink composition.

Example 23

Example 20 was modified by replacing EEOL as a polymerization inhibitor with 1,2-propanediol in an amount of about 0.4% by weight based on the total weight of the imprinting ink composition.

Example 24

Example 23 was modified by increasing the amount of 1,2-propanediol as a polymerization inhibitor to about 0.7% by weight based on the total weight of the imprinting ink composition.

Example 25

Example 23 was modified by increasing the amount of 1,2-propanediol as a polymerization inhibitor to about 1.4% by weight based on the total weight of the imprinting ink composition.

Example 26

Example 17 was modified by replacing the 15% acidified aqueous dispersion of the rutile $TiO_2$ nanoparticles having a size distribution of 5-30 nm with the 15% acidified aqueous dispersion of rutile $TiO_2$ nanoparticles having a size of about 15 nm.

Example 27

Example 26 was modified by increasing the amount of 1,2-propanediol as a polymerization inhibitor to about 1.4% by weight based on the total weight of the imprinting ink composition.

Example 28

Example 26 was modified by increasing the amount of 1,2-propanediol as a polymerization inhibitor to about 0.7% by weight based on the total weight of the imprinting ink composition and by adding 0.3% by weight of the polysiloxane precursor of Formula 6 (APTES) based on the total weight of the imprinting ink composition and adjusting the pH to about 0.

Example 29

Example 28 was modified by adjusting the pH to about 2-3.

Example 30

Example 17 was modified by adjusting the amount of 1,2-propanediol to 1.0% by weight based on the total weight of the imprinting ink composition and by adjusting the pH to 0.

Example 31

Example 30 was modified by adjusting the pH to about 2-3.

Example 32

Example 17 was modified by replacing the 15% acidified aqueous dispersion of the rutile $TiO_2$ nanoparticles having a size distribution of 5-30 nm with the 15% acidified aqueous dispersion of anatase $TiO_2$ nanoparticles having a size of about 15 nm and modified by adjusting the amount of 1,2-propanediol to 0.7% by weight based on the total weight of the imprinting ink composition and adjusting the pH to 0.

Example 33

Example 32 was modified by adjusting the pH to about 2-3.

Example 34

Example 15 was modified by adding about 6.5% by weight of acetyl acetone based on the total weight of the imprinting ink composition and adjusting the pH to 1.5.

Example 35

Example 34 was modified by adjusting the pH to 3.0.

Example 36

Example 19 was modified by adding about 1.4% by weight of acetyl acetone based on the total weight of the imprinting ink composition and adjusting the pH to 1.5.

Example 37

Example 36 was modified by adjusting the pH to 4.0.

Example 38

Example 26 was modified by replacing 1,2-propanediol with acetic acid in an amount of 0.8% by weight based on the total weight of the imprinting ink composition.

Example 39

Example 38 was modified by increasing the amount of acetic acid to 6.6% by weight based on the total weight of the imprinting ink composition.

Example 40

An imprinting ink composition of total weight of 20 grams was obtained by mixing methanol and 7% by weight based on the total weight of the imprinting ink composition of 1-propoxyethanol as a solvent, an 15% acidified aqueous dispersion of rutile $TiO_2$ nanoparticles having a size of 15 nm in an amount of 7% by weight based on the total weight of the imprinting ink composition as the polymeric content and 1,2-propanediol as a polymerization inhibitor in an amount of about 0.4% by weight based on the total weight of the imprinting ink composition. The pH of this composition was adjusted to 1.5 by adding an 1.3% ammonia solution (in methanol) in an amount of 31% by weight based on the total weight of the imprinting ink composition and spin-coated at 1000 rpm onto a silicon wafer. The thus formed layer was subsequently cured at 90° C. for 30 minutes.

Example 41

Example 40 was adjusted by increasing the amount of 1,2-propanediol to 0.7% by weight based on the total weight of the imprinting ink composition.

Example 42

Example 40 was adjusted by increasing the amount of 1,2-propanediol to 1.4% by weight based on the total weight of the imprinting ink composition.

Example 43

Example 40 was adjusted by increasing the amount of 1,2-propanediol to 1.4% by weight based on the total weight of the imprinting ink composition and adjusting the pH to 3.0

Example 44

An imprinting ink composition having a total weight of 20 grams was obtained by mixing 7% by weight methanol and 2% by weight of 1-propoxyethanol as a solvent based on the total weight of the imprinting ink composition, an 15% acidified aqueous dispersion of $ZrO_2$ nanoparticles having a size distribution of 5-15 nm as obtained from Nyacol Nano Technologies, Inc. in an amount of 10% by weight based on the total weight of the imprinting ink composition and 1% by weight of APTES as the polymeric content and 1,2-propanediol as a polymerization inhibitor in an amount of about 2% by weight based on the total weight of the imprinting ink composition. The pH of this composition was adjusted to about 3.5 by adding an 1.3% ammonia solution (in methanol). The composition was spin-coated in 30s at 1000 rpm onto a silicon wafer. The thus formed layer was subsequently cured at 90° C. for 30 minutes.

Example 45

Example 44 was adjusted by increasing the amount of $ZrO_2$ to 15% by weight and increasing the amount of 1,2-propanediol as a polymerization inhibitor to about 3% by weight based on the total weight of the imprinting ink composition.

Evaluation of Examples
Spinning Results

The film forming quality of several examples after curing was visually inspected and categorized on a scale of 1-6, in which:
1=cracked layer
2=dewetted layer
3-4=layer with moderate uniformity
5-6=layer with high uniformity The results are summarized in Table 1.

TABLE 1

| Example | Score |
|---|---|
| 1 | 3 |
| 2 | 4 |
| 3 | 4 |
| 4 | 3 |
| 5 | 3 |
| 6 | 3 |
| 7 | 4 |
| 8 | 1 |
| 9 | 1 |
| 10 | 1 |
| 11 | 2 |
| 12 | 1 |
| 13 | 1 |
| 14 | 2 |
| 15 | 5 |
| 16 | 5 |
| 17 | 6 |
| 18 | 6 |
| 19 | 6 |
| 20 | 6 |
| 21 | 4 |
| 22 | 4 |
| 23 | 4 |
| 24 | 5 |
| 25 | 5 |

From these spinning results, it becomes clear that the quality of the layer formed from the imprinting ink compositions of the present invention are not particularly sensitive to the type of TMO nanoparticles or polymerization inhibitor, but are sensitive to the choice of solvent, with methanol giving better results than water. Using an alkoxy alcohol as a co-solvent such as propoxyethanol further improve the layer quality as the dewetting properties of the layer are reduced. It is noted for the avoidance of doubt that this does not imply that water is an unsuitable solvent per se; it is for instance feasible to deposit the imprinting ink compositions of the present invention using different deposition techniques as previously explained.

Refractive Index Evaluation

The refractive index (n) of the layers formed in some of the above examples has been determined at various wavelengths in the visible part of the electromagnetic spectrum. The results are summarized in Table 2.

TABLE 2

| Example | n (450 nm) | n (550 nm) | n (650 nm) |
|---|---|---|---|
| 17 | 2.00 | 1.93 | 1.90 |
| 19 | 1.99 | 1.92 | 1.89 |
| 26 | 1.74 | 1.69 | 1.69 |
| 27 | 1.84 | 1.79 | 1.77 |
| 28 | 2.00 | 1.94 | 1.90 |
| 29 | 1.97 | 1.90 | 1.87 |
| 30 | 2.00 | 1.93 | 1.90 |
| 31 | 1.99 | 1.92 | 1.88 |
| 32 | 2.00 | 1.93 | 1.90 |
| 33 | 1.98 | 1.91 | 1.88 |
| 34 | 1.80 | 1.78 | 1.72 |
| 35 | 1.80 | 1.75 | 1.72 |
| 36 | 1.90 | 1.85 | 1.83 |
| 37 | 1.86 | 1.81 | 1.79 |
| 40 | 1.74 | 1.69 | 1.69 |
| 41 | 1.80 | 1.74 | 1.71 |
| 42 | 1.84 | 1.79 | 1.77 |
| 43 | 1.88 | 1.83 | 1.80 |

It can be determined from Table 2 that the imprinting ink compositions can be used to form layers having a high refractive index. Where the TMO nanoparticle network is interspersed with another network such as a polysiloxane network (examples 28 and 29), a particularly high refractive index layer can be achieved, which, without wishing to be bound by theory, is believed to be the result of the effective filling of the voids between the TMO nanoparticles in the 3-D network formed by these nanoparticles. Where such composite layers are formed, it may be preferable to use nanoparticles of a specific size rather than a size distribution in order to create the voids in between the nanoparticles, which voids may be absent or less pronounced where TMO nanoparticles of a particular size distribution are being used due to the fact that smaller nanoparticles can fill the voids between larger nanoparticles. However, where the layer is formed from TMO nanoparticles alone, better results are achieved using a particle size distribution as for instance is evident from examples 17 and 26. Moreover, by lowering the pH, a further increase of the refractive index of the formed layer can be achieved as is evident from examples 28-33.

FIGS. 7 to 12 depict SEM images of various imprinting ink compositions comprising rutile TiO2 nanoparticles in an amount of 7.0% by weight based on the total weight of the imprinting ink composition as the polymeric composition having a size distribution of 5-30 nm in methanol imprinted with a PDMS stamp having a grid of cylindrical protrusions of about 200 nm diameter. FIG. 13 is a SEM image of a comparative example in which anatase TiO2 nanoparticles in an amount of 7.0% by weight based on the total weight of the imprinting ink composition as the polymeric content having a size distribution of 50-70 nm were used. The compositions are summarized in Table 3:

TABLE 3

Figure 7:
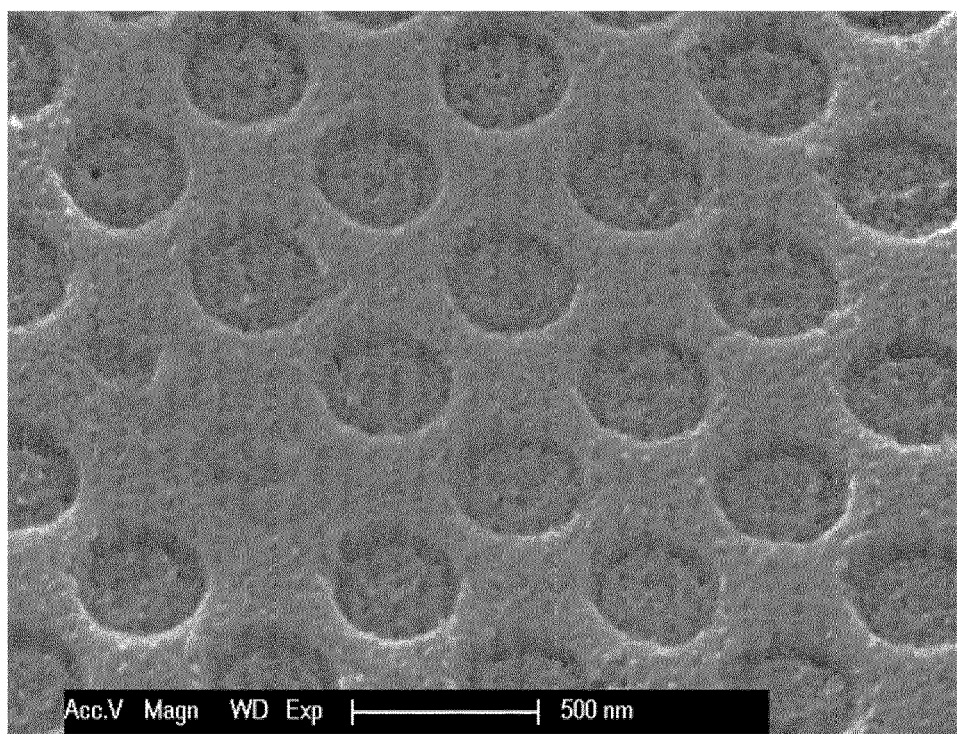
FIG. 7-12 depict SEM images of imprinted layers using imprinting ink compositions according to embodiments of the present invention.
Figure 8:
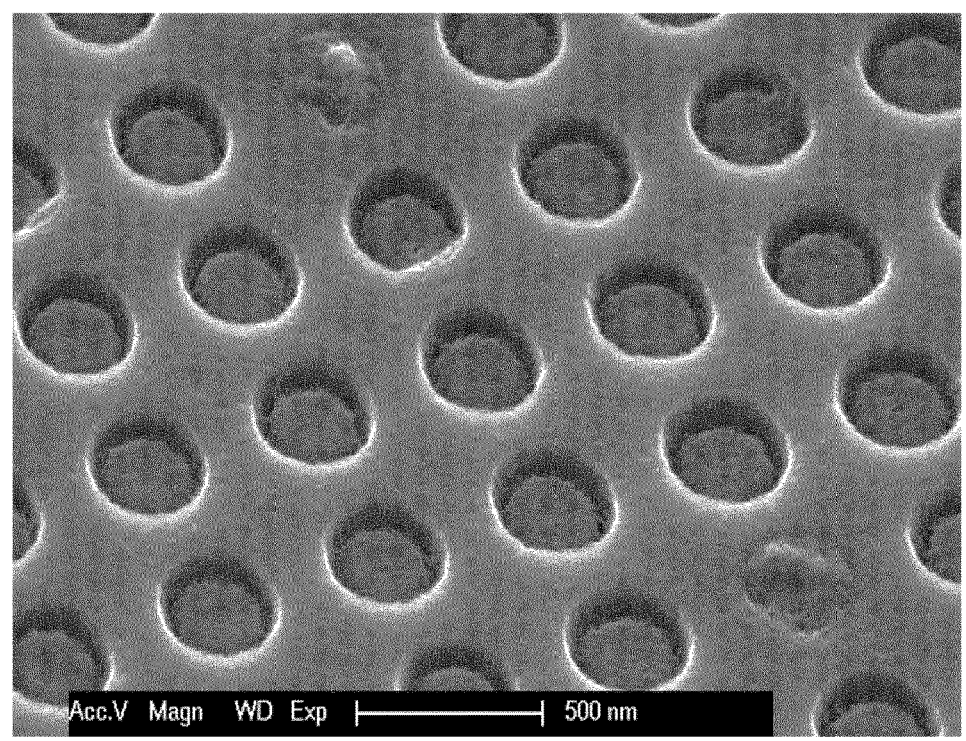
Figure 9:
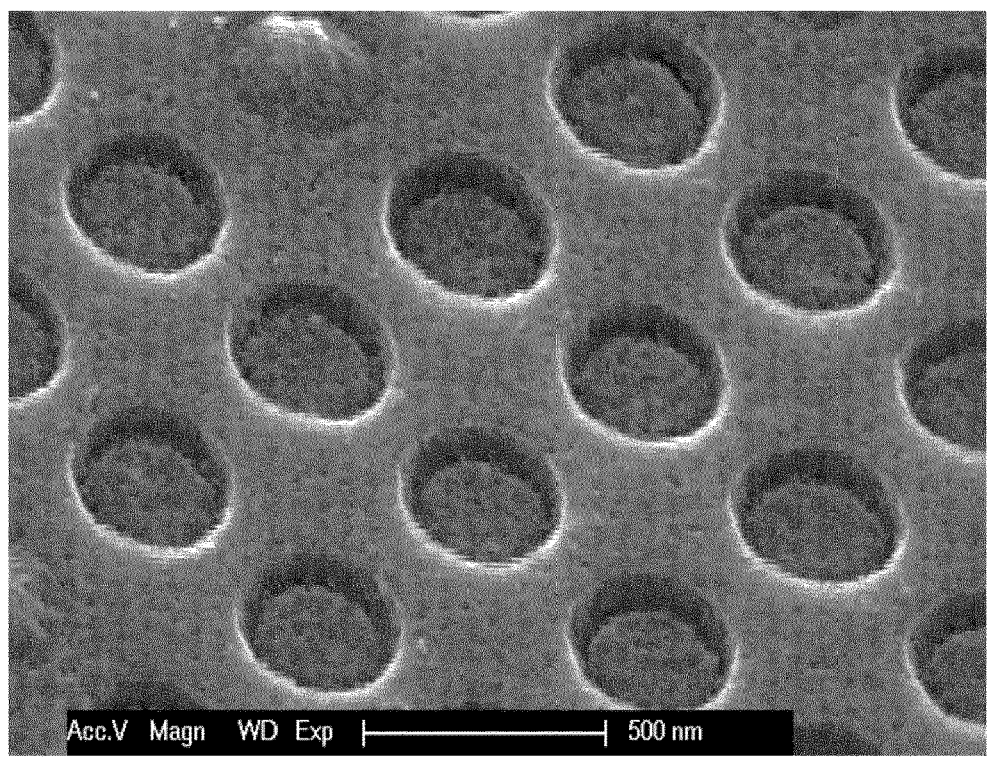
Figure 10:
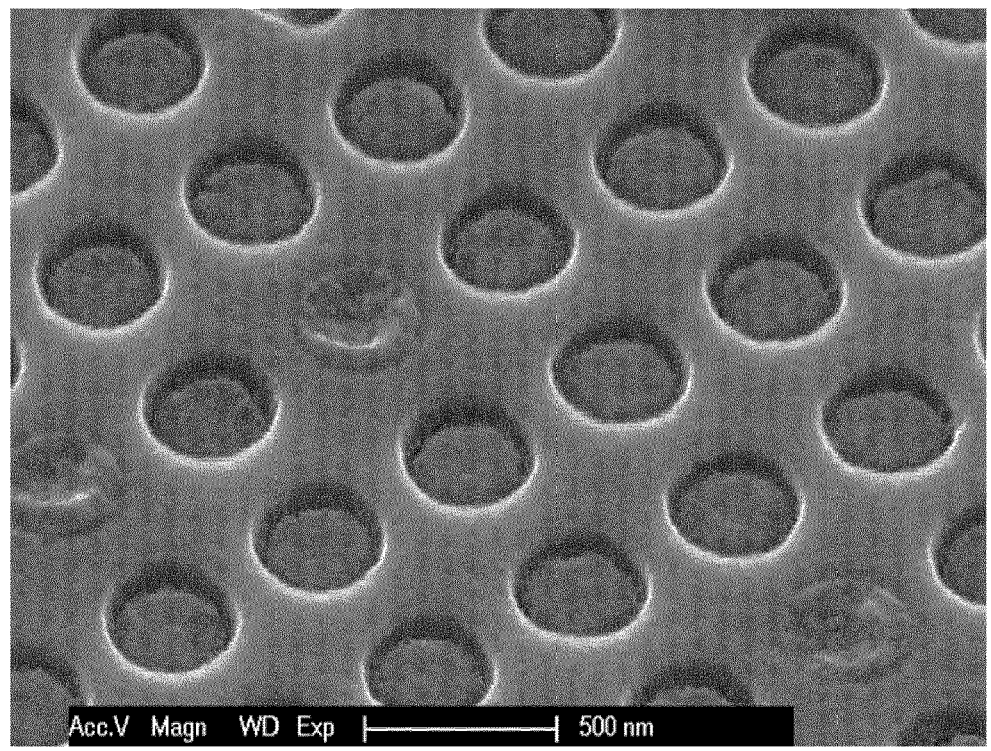
Figure 11:
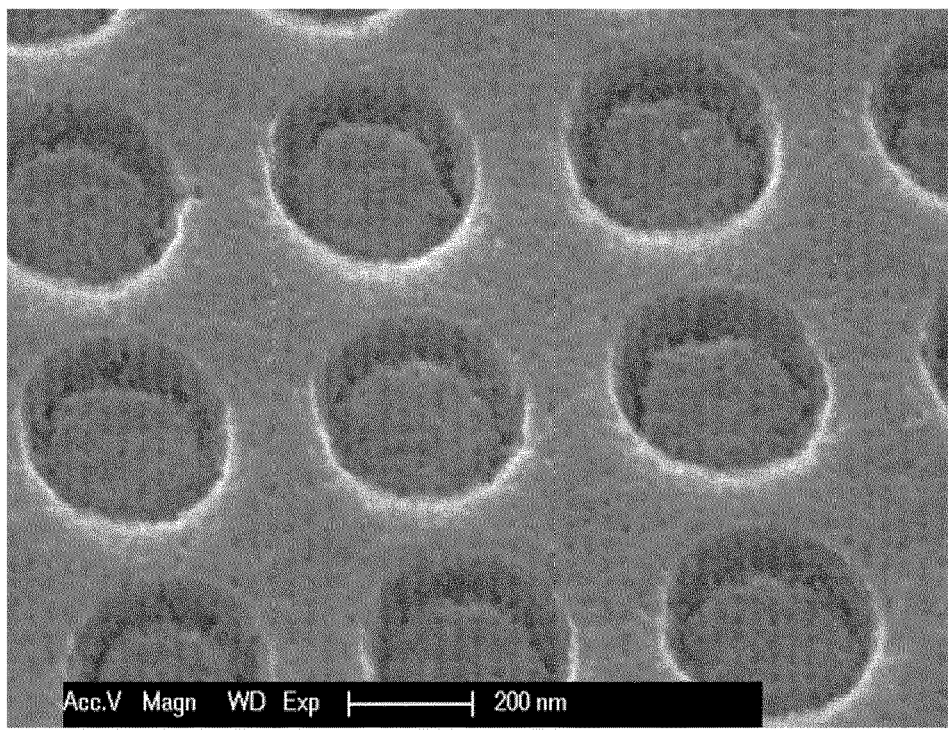
Figure 12:
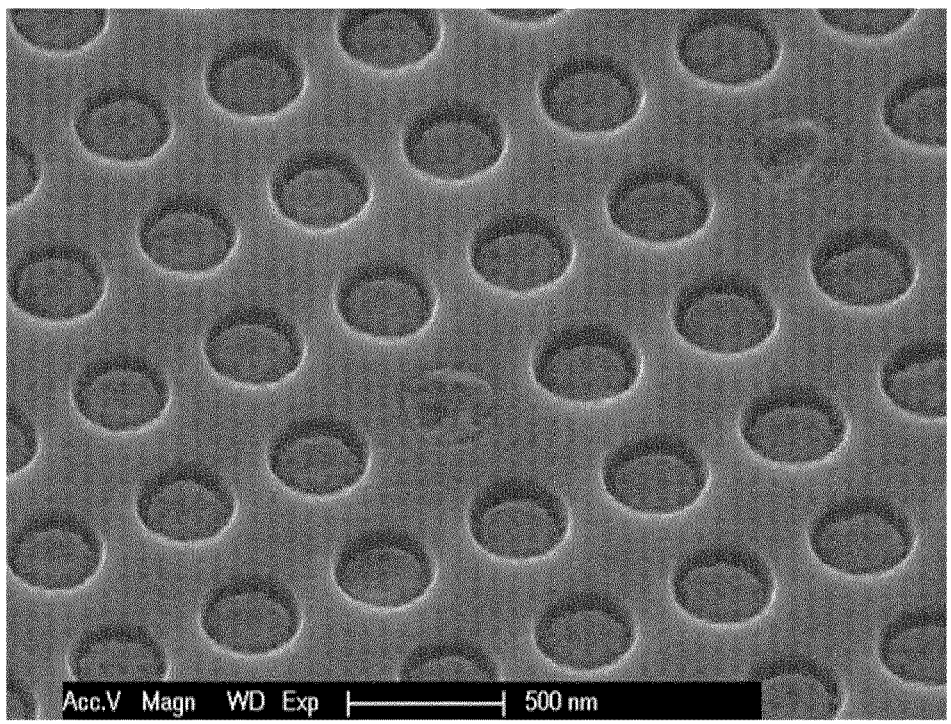
Figure 13:
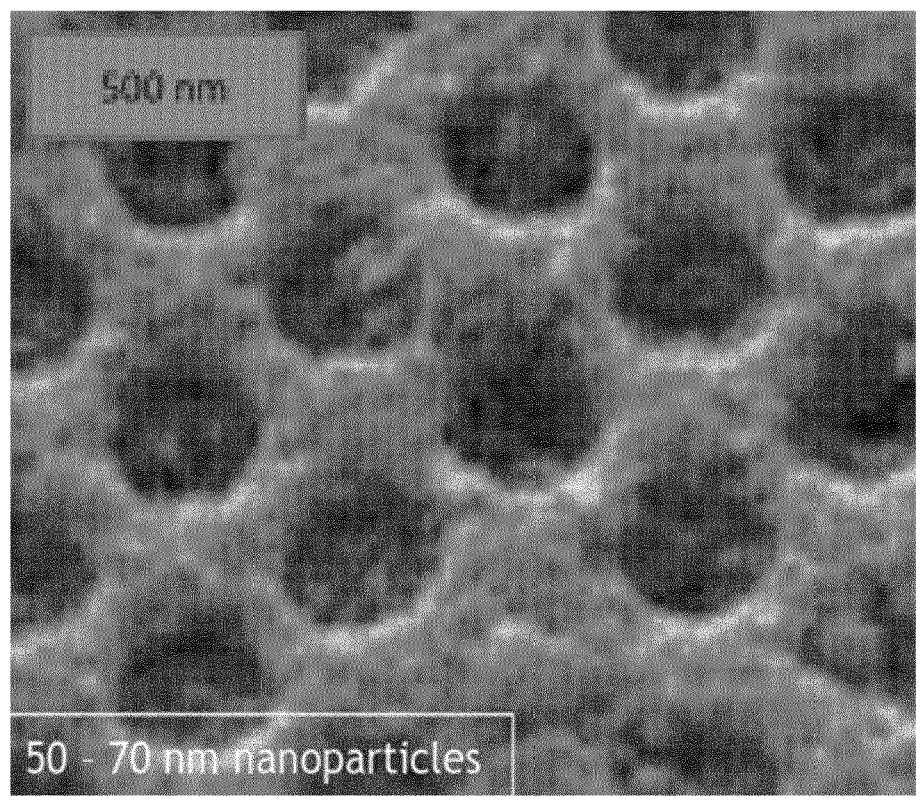
FIG. 13 depicts a SEM image of an imprinted layers using an imprinting ink compositions according to a comparative example.

| FIG. 7 | 1.4 wt % 1-2 propanediol, 7 wt % propoxyethanol, 6.5% acetyl acetone, pH > 6 |
|---|---|
| FIG. 8 | 1.4 wt % 1-2 propanediol, 7 wt % propoxyethanol, 6.5% acetyl acetone, pH = 1.5 |
| FIG. 9 | 1.4 wt % 1-2 propanediol, 6.5 wt % propoxyethanol, 0.9% acetyl acetone, pH = 4 |
| FIG. 10 | 1.4 wt % 1-2 propanediol, 6.5 wt % propoxyethanol, 0.9% acetyl acetone, pH = 1.5 |
| FIG. 11 | 7 wt % propoxyethanol, 7% acetyl acetone, pH = 3 |
| FIG. 12 | 7 wt % propoxyethanol, 7% acetyl acetone, pH = 1.5 |
| FIG. 13 | 7 wt % propoxyethanol, 0.7 wt % 1,2-propanediol, pH = 4.0 |

Figure 14:
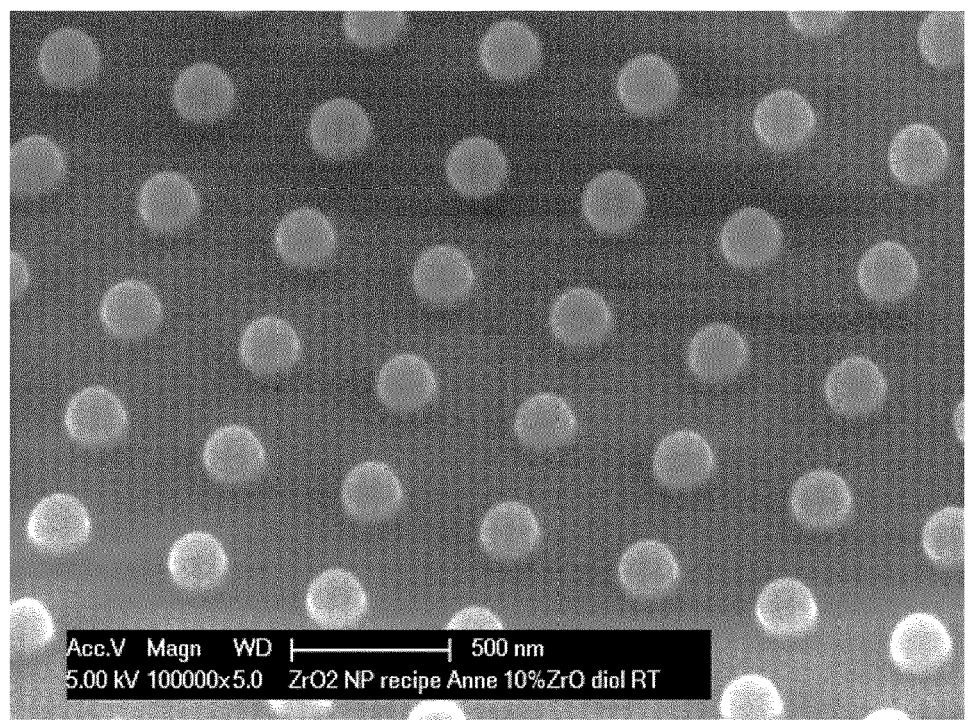
FIGS. 14 and 15 depict SEM images of imprinted layers using imprinting ink compositions according to alternative embodiments of the present invention.
Figure 15:
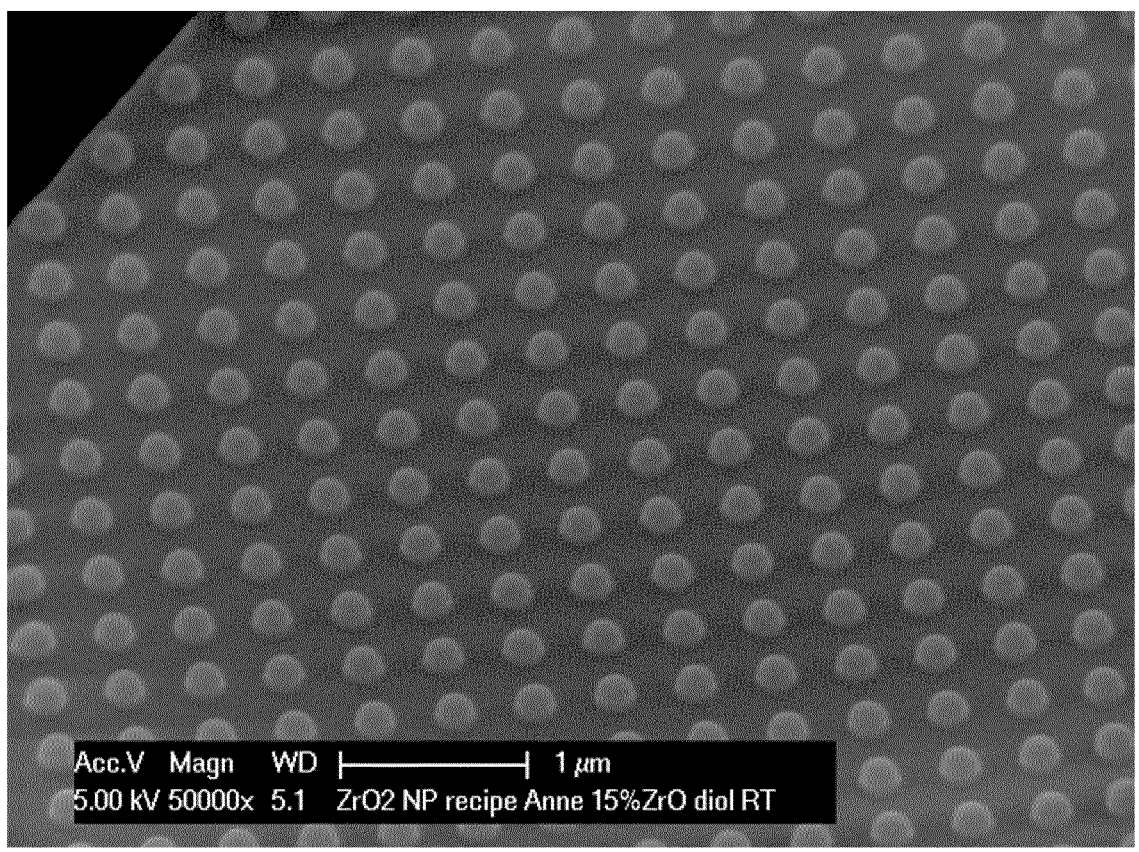

The SEM images of FIGS. 7, 9 and 11 show less well-defined patterns than FIGS. 8, 10 and 12, which indicates that lowering of the pH yields better imprinting results, i.e. better defined patterned layers formed from the imprinting ink compositions of the present invention. Moreover, FIG. 13 demonstrates that if TMO nanoparticles of increased size compared to the preferred size distribution of 5-40 nm are being used. FIGS. 14 and 15 depict SEM images of patterned layers formed from the imprinting ink compositions of examples 44 and 45 respectively comprising $ZrO_2$ instead of $TiO_2$ nanoparticles. It can be immediately recognized that patterns of a high fidelity are equally achievable when replacing $TiO_2$ nanoparticles with transition metal oxide nanoparticles of a different transition metal (here zirconium), thus demonstrating that the principles of the present invention may be applied to any suitable type of transition metal oxide nanoparticles.

It should be noted that the above-mentioned embodiments illustrate rather than limit the invention, and that those skilled in the art will be able to design many alternative embodiments without departing from the scope of the appended claims. In the claims, any reference signs placed between parentheses shall not be construed as limiting the claim. The word "comprising" does not exclude the presence of elements or steps other than those listed in a claim. The word "a" or "an" preceding an element does not exclude the presence of a plurality of such elements. The invention can be implemented by means of hardware comprising several distinct elements. In the device claim enumerating several means, several of these means can be embodied by one and the same item of hardware. The mere fact that certain measures are recited in mutually different dependent claims does not indicate that a combination of these measures cannot be used to advantage.

The invention claimed is:

1. An imprinting ink composition for nanoimprinting lithography, comprising:
  a solvent;
  polymerizable content dissolved and/or dispersed in the solvent, the polymerizable content comprising transition metal oxide particles in a high concentration, forming at least 80% by weight of the total weight of the polymerizable content for increasing a refractive index of pattern layers formed from the imprinting ink composition, the polymerizable content forming 2-25% by weight based on the total weight of the imprinting ink composition; and
  a polymerization inhibitor of Formula 1 present in a range of 0.1-3.0% by weight based on the total weight of the imprinting ink composition sufficient for preventing premature polymerization of the polymerizable content resulting from the high concentration of the transition metal oxide particles:

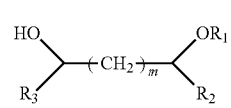

Formula 1 wherein in Formula 1, $R_1$ is hydrogen, $C_1$-$C_4$ alkyl or $-(-C_2H_5-O-)_n-R_{13}$, wherein n is 1, 2 or 3 and $R_{13}$ is a $C_1$-$C_3$ alkyl; $R_2$ and $R_3$ individually are selected from hydrogen or $C_1$-$C_4$ alkyl and m is 0, 1, 2 or 3; and
  an ammonia solution present in a range of 10-40% by weight based on the total weight of the imprinting ink composition sufficient for increasing a pH of the imprinting ink composition to a range of 1-2.5 to reduce corrosion of substrate material of a patterned elastomeric stamp used to imprint layers formed of the imprinting ink composition.

2. The imprinting ink composition of claim 1, wherein the transition metal oxide particles have a particle size distribution from a lower value ranging from 1-10 nm to an upper value ranging from 20-40 nm, wherein the particle size distribution is 5-30 nm.

3. The imprinting ink composition of claim 1, wherein the transition metal oxide particles are selected from $TiO_2$, $ZrO_2$, $HfO_2$, $Ta_2O_3$, $V_2O_3$, $Nb_2O_3$, $Y_2O_3$, $Fe_2O_3$, $BaTiO_3$ and $SrTiO_3$ particles.

4. The imprinting ink composition of claim 3, wherein the transition metal oxide particles are anatase or rutile $TiO_2$ particles, rutile $TiO_2$ particles.

5. The imprinting ink composition of claim 1, further comprising up to 20%, by weight of a polymer matrix precursor based on a total weight of the polymerizable content.

6. The imprinting ink composition of claim 5, wherein the polymer matrix precursor is a polysiloxane precursor.

7. The imprinting ink composition of claim 6, wherein the polysiloxane precursor is a precursor comprising at least one monomeric unit according to Formula 5:

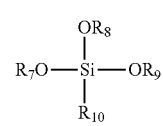

Formula 5 wherein $R_7$-$R_9$ are individually selected from $C_1$-$C_3$ alkyl; and $R_{10}$ is selected from $C_1$-$C_3$ alkyl, $C_1$-$C_3$ alkoxy and $-(CH_2)_nNHR_{11}$, wherein $R_{11}$ is selected from hydrogen and $-(CH_2)_mNH_2$, wherein m and n are individually selected from 2, 3 and 4.

8. The imprinting ink composition of claim 7, wherein the polysiloxane precursor comprises at least one monomeric unit according to Formula 6-9:

Formula 6

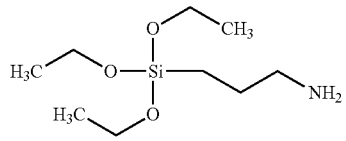

Formula 7

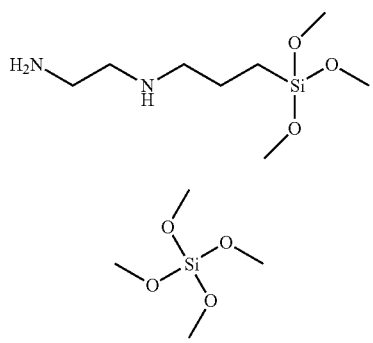

Formula 8

Formula 9

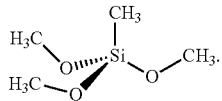

9. The imprinting ink composition of claim 1, wherein the solvent is selected from at least one of water and methanol and optionally further comprises propoxyethanol up to 30% by weight based on the total weight of the imprinting ink composition.

10. The imprinting ink composition of claim 1, wherein the ammonia solution has a mass fraction of 1.0-2.0 wt %.

11. The imprinting ink composition of claim 1, wherein the polymerization inhibitor of Formula 1 comprises 1,2-propanediol.

12. The imprinting ink composition of claim 1, wherein the polymerization inhibitor of Formula 1 comprises 2-(2-ethoxyethoxy) ethanol (EEOL).

* * * * *